US008802969B2

(12) United States Patent
Lim et al.

(10) Patent No.: US 8,802,969 B2
(45) Date of Patent: Aug. 12, 2014

(54) PHOTOVOLTAIC DEVICE AND METHOD FOR MANUFACTURING THEREOF

(75) Inventors: Koeng Su Lim, Daejeon (KR); Jin-Wan Jeon, Daejeon (KR)

(73) Assignee: KISCO (KR)

( * ) Notice: Subject to any disclaimer, the term of this patent is extended or adjusted under 35 U.S.C. 154(b) by 201 days.

(21) Appl. No.: 12/851,823

(22) Filed: Aug. 6, 2010

(65) Prior Publication Data

US 2011/0030777 A1  Feb. 10, 2011

(30) Foreign Application Priority Data

Aug. 6, 2009 (KR) ........................ 10-2009-0072353

(51) Int. Cl.
*H01L 31/00* (2006.01)
*H01L 27/142* (2014.01)

(52) U.S. Cl.
CPC ................................ *H01L 27/1426* (2013.01)
USPC ........................................................ 136/256

(58) Field of Classification Search
CPC ............ H01L 27/1425; H01L 27/1426; H01L 27/1427; H01L 31/022433
USPC ................. 136/244, 255, 256; 438/58, 68, 98
See application file for complete search history.

(56) References Cited

U.S. PATENT DOCUMENTS

| 4,808,242 | A | | 2/1989 | Murata et al. | |
|---|---|---|---|---|---|
| 5,176,758 | A | * | 1/1993 | Nath et al. | 136/251 |
| 2002/0050286 | A1 * | | 5/2002 | Kubota | 136/244 |
| 2008/0276980 | A1 * | | 11/2008 | Ogasahara | 136/244 |
| 2009/0014064 | A1 * | | 1/2009 | Shinohara | 136/256 |

FOREIGN PATENT DOCUMENTS

| CN | 1983567 | | | 6/2007 |
|---|---|---|---|---|
| JP | 53138288 | A | * | 12/1978 |
| JP | 61-035573 | | | 2/1986 |
| JP | 61035573 | A | * | 2/1986 |
| JP | 62-142368 | | | 6/1987 |
| JP | 63-119586 | | | 5/1988 |
| JP | 64-067978 | | | 3/1989 |
| JP | 2005197537 | A | * | 7/2005 |
| JP | 2007-165902 | | | 6/2007 |

* cited by examiner

*Primary Examiner* — Eli Mekhlin
(74) *Attorney, Agent, or Firm* — The Belles Group, P.C.

(57) ABSTRACT

Disclosed is a method for manufacturing a photovoltaic device. The method for manufacturing a photovoltaic device includes providing substrates having trenches formed therein, forming a first electrode layer, and forming an auxiliary electrode layer in areas between the trenches such that the auxiliary electrode layer is located on or under the first electrode layer, the auxiliary electrode layer having electrical resistance less than that of the first electrode layer, and contacting with a portion of an area of the first electrode layer, forming a photovoltaic layer on the first electrode layer or the auxiliary electrode layer, forming a second electrode layer by obliquely depositing a second conductive material on the photovoltaic layer, etching the photovoltaic layer formed in the trenches such that the first electrode layer or the auxiliary electrode layer are exposed and forming a conductive layer by obliquely depositing a third conductive material on the second electrode layer such that the second electrode layer and either the first electrode layer or the auxiliary electrode layer are electrically connected to each other within the trench, the first electrode layer or the auxiliary electrode layer formed in one area generating electricity from light, and the second electrode layer formed in another area generating electricity from light.

9 Claims, 37 Drawing Sheets

PHOTOVOLTAIC DEVICE AND METHOD FOR MANUFACTURING THEREOF

CROSS-REFERENCE TO RELATED APPLICATIONS

This application claims the benefit of Korean Patent Application. No. 10-2009-0072353, filed on Aug. 6, 2009, which is hereby incorporated by reference in its entirety.

FIELD OF THE INVENTION

This invention relates to a photovoltaic device and a method for manufacturing thereof.

BACKGROUND OF THE INVENTION

In general, a photovoltaic device is a component for converting sunlight into electric energy by using a semiconductor. The photovoltaic device is composed substantially of unit cells. The unit cells are electrically connected in series to each other in the form of an integral module, thereby supplying high voltage to the outside thereof.

Based on a material used for the photovoltaic device, the photovoltaic device is largely divided into a silicon based photovoltaic device, a compound based photovoltaic device and an organic material based photovoltaic device. The silicon based photovoltaic device, according to a semiconductor phase, is divided into a single crystalline silicon photovoltaic device, a polycrystalline silicon photovoltaic device, and an amorphous silicon photovoltaic device.

In addition, based on the thickness of a semiconductor, the photovoltaic device is divided into a bulk (substrate) type photovoltaic device and a thin-film type photovoltaic device. The thin-film type photovoltaic device has its semiconductor layer having a thickness less than from several micrometers (μm) to several tens of μm. In the silicon based photovoltaic device, the single crystalline silicon photovoltaic device and the polycrystalline silicon photovoltaic device are included in the bulk type photovoltaic device. The amorphous silicon photovoltaic device is included in the thin-film type photovoltaic device.

The compound based photovoltaic device includes a bulk type photovoltaic device and a thin-film type photovoltaic device. The bulk type photovoltaic device includes Gallium Arsenide (GaAs) and Indium Phosphide (InP) of group III-V. The thin-film type photovoltaic device includes Cadmium Telluride (CdTe) of group II-VI and Copper Indium Diselenide (CuInSe2) of group I-III-VI. The organic based photovoltaic device is largely divided into an organic molecule type photovoltaic device and an organic and inorganic complex type photovoltaic device. In addition, the organic based photovoltaic device also includes a dye-sensitized photovoltaic device. Here, the organic molecule type photovoltaic device, the organic and inorganic complex type photovoltaic device and the dye-sensitized photovoltaic device are included in the thin-film type photovoltaic device.

In such a photovoltaic device, it is required to increase the photovoltaic conversion efficiency by reducing an ineffective area and by widening an effective area. Also, the photovoltaic device should be able to supply a required amount of voltage.

SUMMARY OF THE INVENTION

One aspect of this invention is a method for manufacturing a photovoltaic device. The method includes: providing substrates having trenches formed therein; forming first electrode layers in areas between the trenches, and forming auxiliary electrode layers in areas between the trenches such that the auxiliary electrode layers are located on or under the first electrode layer, the auxiliary electrode layers having electrical resistances less than that of the first electrode layer, and contacting with a portion of an area of the first electrode layer; forming photovoltaic layers on the first electrode layer or the auxiliary electrode layer; forming second electrode layers by obliquely depositing a second conductive material on the photovoltaic layer; etching the photovoltaic layer formed in the trenches such that the first electrode layer and the auxiliary electrode layer are exposed; and forming conductive layers by obliquely depositing a third conductive material on the second electrode layer such that the first electrode layer or the auxiliary electrode layer and the second electrode layer are electrically connected to each other within the trench, the first electrode layer or the auxiliary electrode layer formed in one area generating electricity from light, and the second electrode layer formed in another area generating electricity from light.

Another aspect of this invention is a method for manufacturing a photovoltaic device. The method includes: forming first electrode layers on a substrate such that the first electrode layers are adjacent to each other, the first electrode layers having predetermined thicknesses and predetermined widths; forming auxiliary electrode layers on or under the first electrode layers such that the auxiliary electrode layers come in contact with the first electrode layers, the auxiliary electrode layers having electrical resistances less than that of the first electrode layer; forming a photovoltaic layer on an area between the adjacent first electrode layers and on an area of either the first electrode layers or the auxiliary electrode layers; forming a second electrode layer by obliquely depositing a second conductive material on the photovoltaic layer; etching the photovoltaic layer such that the auxiliary electrode layer located in an area between the adjacent second electrode layers is exposed; forming a conductive layer by obliquely depositing a third conductive material on the second electrode layer such that the auxiliary electrode layer formed on an area of one first electrode layer among the adjacent first electrode layers is electrically connected to the second electrode layer formed on an area of another first electrode layer.

A further aspect of this invention is a photovoltaic device including: a substrate having trenches formed therein; first electrode layers formed in areas between the trenches; auxiliary electrode layers being formed in areas between the trenches, having electrical resistances less than that of the first electrode layer and being located on or under the first electrode layer so as to contact with a portion of the first electrode layer; photovoltaic layers located on the first electrode layer or on the auxiliary electrode layer; second electrode layers located on the photovoltaic layer; and conductive layers allowing the first electrode layer or the auxiliary electrode layer and the second electrode layer to be electrically connected to each other within the trench, the first electrode layer or the auxiliary electrode layer formed in one area generating electricity from light among the areas, and the second electrode layer formed in another area generating electricity from light among the areas.

Yet another aspect of this invention is a photovoltaic device including: a substrate; a first electrode layer being located adjacently to each other and having a-predetermined thickness and a predetermined width; an auxiliary electrode layer having electrical resistances less than that of the first electrode layer and being located on or under the first electrode layers in such a manner as to come in contact with the first electrode layers; a photovoltaic layer located on the first electrode layers or on the auxiliary electrode layers and located in an area between the adjacent first electrode layers; a second electrode layer located on the photovoltaic layer; and a conductive layer allowing the auxiliary electrode layer and the second electrode layer to be electrically connected to each other, the auxiliary electrode layer formed in an area of one first electrode layer among the adjacent first electrode layers, and the second electrode layer formed in an area of another first electrode layer among the adjacent first electrode layers.

BRIEF DESCRIPTION OF THE DRAWINGS

The embodiment will be described in detail with reference to the following drawings.

DETAILED DESCRIPTION OF THE INVENTION

The following embodiments of the present invention will be described in detail with reference to the accompanying drawings.

Figure 1A:
FIGS. 1a to 1n show a method for manufacturing a photovoltaic device according to a first embodiment of the present invention.
Figure 1B:
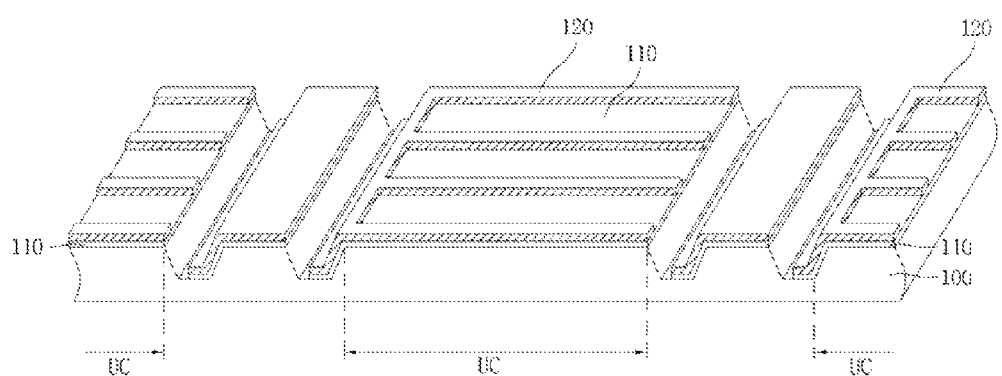
Figure 1C:
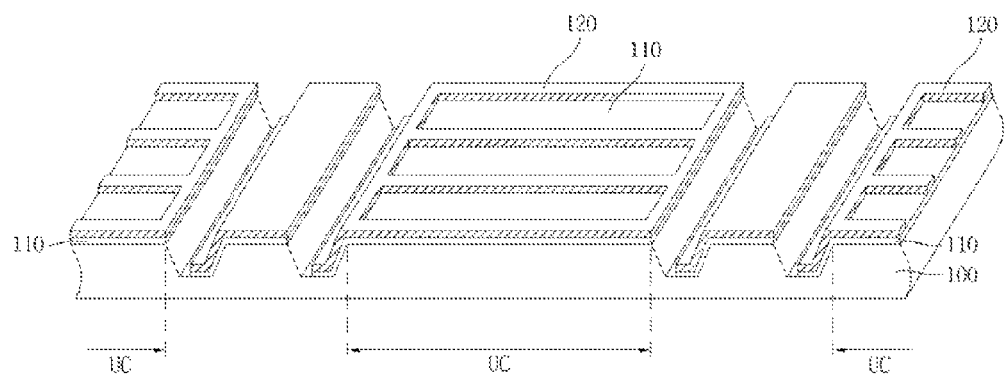
Figure 1D:
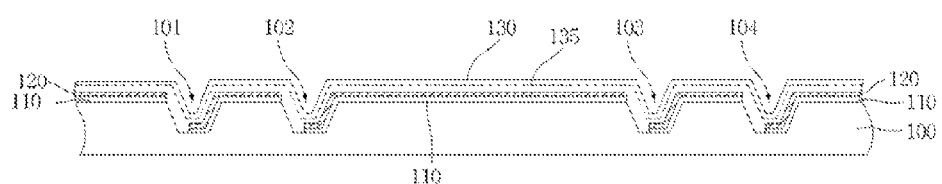
Figure 1E:
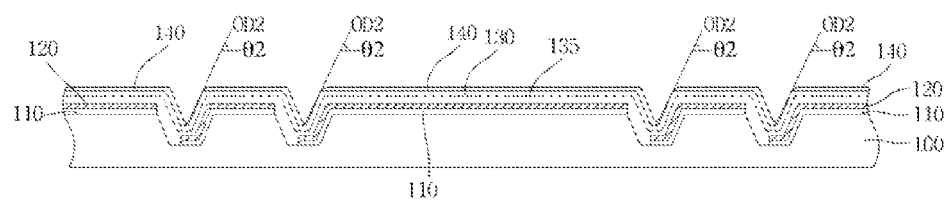
Figure 1F:
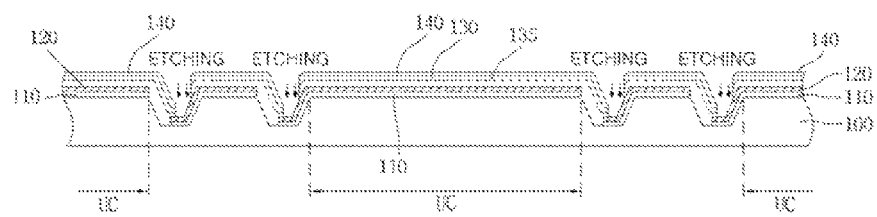
Figure 1G:
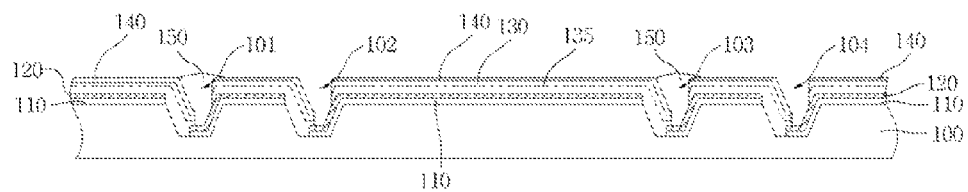
Figure 1H:
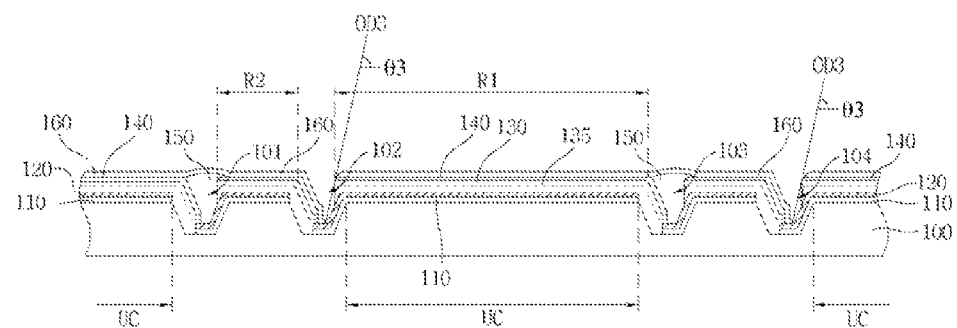
Figure 1I:
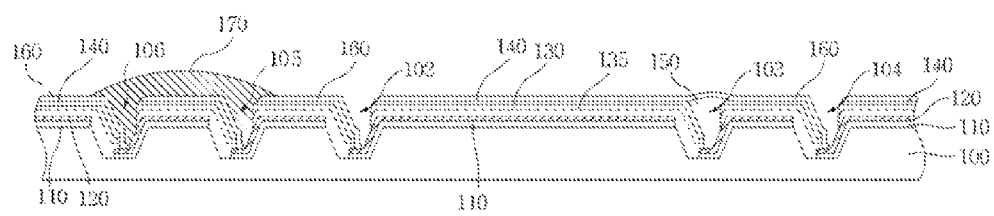
Figure 1J:
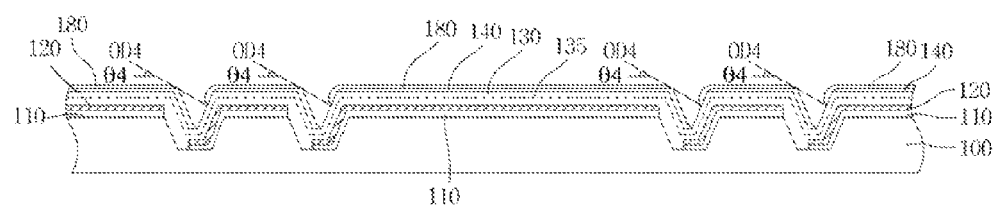
Figure 1K:
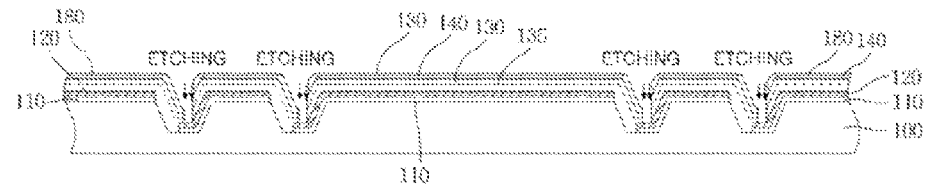
Figure 1L:
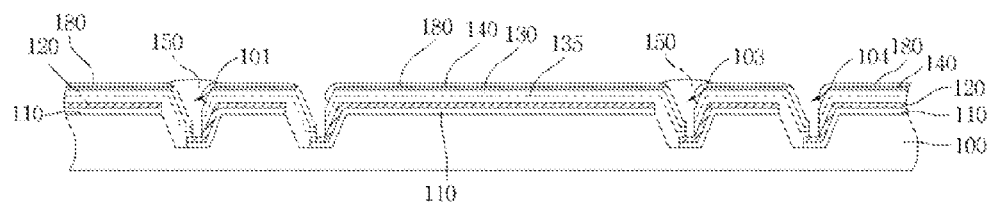
Figure 1M:
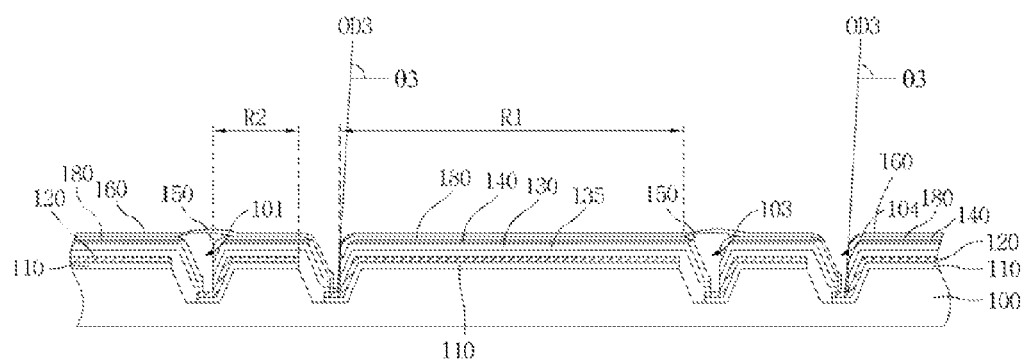
Figure 1N:
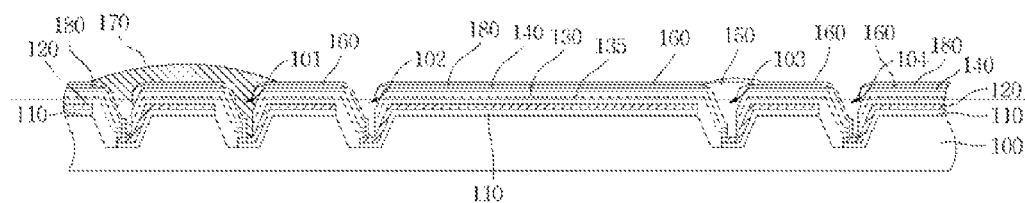

FIGS. 1a to 1n show a method for manufacturing a Photovoltaic device according to a first embodiment of the present invention.

As shown in FIG. 1a, a substrate 100 is provided having trenches 101, 102, 103 and 104 formed therein.

Light is primarily incident on the substrate 100. Therefore, the substrate 100 is made of a transparent insulating material having an excellent light transmittance. For example, the substrate 100 may be one of a glass substrate, a plastic substrate and a nano-composite substrate. The glass substrate is made of materials such as a soda lime glass or a tempered glass and the like. The nano-composite substrate is a system in which nano particles are dispersed in the form of a dispersed phase in a dispersive medium having a continuous phase. The dispersive medium may be formed of an organic solvent, a plastic material, a metallic material or a ceramic material. The nano particles may be formed of a plastic material, a metallic material or a ceramic material. When the dispersive medium is formed of the organic solvent, the organic solvent is removed by heat treatment, and then the nano particles only may remain.

Under the condition that the glass substrate, the plastic substrate or the nano-composite substrate and the like are molten, the trenches 101, 102, 103 and 104 are formed in the form of stripes by using an embossing process before the molten substrate is hardened. Moreover, the trenches 101, 102, 103 and 104 may be formed by using a hot-embossing process without melting the substrates.

The substrate 100 may include a glass material and a plastic material coated on the glass or may include a glass material and a nano-composite material thin-film coated on the glass material. In this case, the trenches 101, 102, 103 and 104 are formed in the plastic material thin-film or the nano-composite material thin-film using the hot-embossing process. Additionally, during the process in which the plastic material thin-film or the nano-composite material thin-film is coated on the glass, the trenches 101, 102, 103 and 104 are formed in the plastic material thin-film or the nano-composite material thin-film using the embossing process. Here, the plastic material or the nano-composite material thin-film may include a thermosetting material or an UV curing material.

It is easier to form the trench in the plastic thin-film coated on the glass material or in the nano-composite material thin-film coated on the glass material than to directly form the trench in the glass material.

The trenches 101, 102, 103 and 104 can be formed not only by the embossing process or the hot-embossing process but also by a wet etching process, a dry etching process, a mechanical process such as a grinding process or a cutting process, and an optical process such as a laser scribing process.

The foregoing materials of the substrate and the method of forming the trenches can be commonly applied to the description of the following embodiments.

Referring to FIG. 1 a a first electrode layer 110 is formed by obliquely depositing (OD1) a first conductive material at an angle of θ1 on the substrate 100. Owing to deposition straightness, the first electrode layer 110 is formed by depositing the first conductive material on a portion of the bottom surface of each of the trenches 101, 102, 103 and 104 of the substrate 100, on one side surface of each of the trenches 101, 102, 103 and 104, and on the substrate 100 in the areas between the trenches 101, 102, 103 and 104. Due to the correlation between the oblique deposition angle θ1 and the cross-sectional shape of each of the trenches 101, 102, 103 and 104 formed on the substrate 100, the first conductive material is not deposited on a portion of each of the trenches 101, 102, 103 and 104.

To perform such an oblique deposition, while it is possible to use a deposition method having straightness like an electronic beam evaporation, a thermal evaporation, a sputtering or a spray and the like, the deposition method is not limited to this. The method for depositing the first conductive material can be also applied to the following embodiments. Since light which has transmitted through the substrate 100 is incident on the first conductive material, the first conductive material is required to allow light to transmit therethrough. To this end, the first conductive material is made of a transparent conductive material including at least one of ZnO, SnO2 and ITO. The material of the first conductive material can be applied to the following embodiments.

The first electrode layer 110 and an auxiliary electrode layer 120 are formed in an area between adjacent trenches of the substrate 100. The auxiliary electrode layer 120 has an electrical resistance less than that of the first electrode layer 110 and contacts with a portion of the area of the first electrode layer. Here, the auxiliary electrode layer 120 is formed on the first electrode layer 110 in the first embodiment. The auxiliary electrode layer 120 is formed under the first electrode layer 110 in the second embodiment, as described in more detail below.

Referring to FIG. 1b the auxiliary electrode layer 120 having an electrical resistance less than that of the first electrode layer 110 is formed on a portion of the area of the first electrode layer 110. The first electrode layer 110 allows light to transmit therethrough and may have a relatively larger electrical resistance. Therefore, the more the width of a unit cell (UC) area increases, the more the width of the first electrode layer 110 increases, so that the electrical resistance of the first electrode layer 110 also increases. As such, when the electrical resistance of the first electrode layer 110 increases, the photovoltaic conversion efficiency of a photovoltaic device is reduced. The unit cell (UC) area generates electricity from light.

In order to increase the photovoltaic conversion efficiency with respect to the photovoltaic device's substrate 100 having a constant area, it is necessary that a ratio of an ineffective area, which does not generate electric current, to the entire area of the substrate 100 should be reduced and a ratio of an effective area, which generates electric current, to the entire area of the substrate 100 should be increased. The width of the unit cell (UC) area should be increased so as to increase the ratio of the effective area to the entire area of the substrate 100.

When the auxiliary electrode layer 120 is formed to have an electrical resistance less than that of the first electrode layer 110, it is possible to compensate for the efficiency degradation of the photovoltaic device caused by the electrical resistance of the first electrode layer 110. Moreover, since the width of the unit cell (UC) area may be increased without efficiency degradation, the efficiency of the photovoltaic device may be increased according to the increase of the effective area.

As described above, it is possible to secure the efficiency of the photovoltaic device regardless of the increase of the effective area, thereby easily changing the number of the unit cells (UC) formed on the substrate 100.

That is, when the first electrode layer 110 only is formed, there is a limit to the increase of the width of the unit cell (UC) area because of the increase of the electrical resistance of the first electrode layer 110. Therefore, it is required that the number of the unit cells (UC) formed on the substrate 100 should be equal to or more than a specific value. For example, if the width of the substrate is 80 cm and the maximum width of the unit cell (UC) is 8 mm in consideration of the electrical resistance of the first electrode layer 110, at least 100 unit cells (UCs) may be formed on the substrate 100. If 100 unit cells (UCs) are electrically connected in series to each other and if one unit cell (UC) generates a voltage of 0.9V, the photovoltaic device formed on the substrate 100 having a width of 80 cm cannot supply voltage less than 90V. In other words, when the first electrode layer 110 only is formed, the photovoltaic device cannot flexibly supply voltage.

On the other hand, when the auxiliary electrode layer 120 is formed to be in contact with the first electrode layer 110, as described in the first embodiment, the efficiency of the photovoltaic device is secured irrespective of the width of the unit cell (UC) area, thereby also easily changing the number of the unit cells (UC) which can be formed on the substrate 100. That is, the auxiliary electrode layer 120 allows the photovoltaic device to flexibly supply voltage.

The function of the auxiliary electrode layer 120 is applied to the following other embodiments as well as the first embodiment.

In the first embodiment of the present invention, the auxiliary electrode layer 120 may include at least one of Al, Cu, Au, Ag, Zn, W, Ni and Cr. The auxiliary electrode layer 120 may be formed by using one of a deposition method using a metal mask, an ink jet method, a jet spray method, a screen printing method, a nano imprint method or a stamping method.

The material and forming method of the auxiliary electrode layer 120 is applied to the following other embodiments as well as the first embodiment.

The auxiliary electrode layer 120 functions to reduce the electrical resistance of the first electrode layer 110 and may have a shape capable of allowing light to easily transmit by reducing a shadow effect caused by the auxiliary electrode layer 120. For example, the shape of the auxiliary electrode layer 120 is a fork shape as shown in FIG. 1b or a ladder shape as shown in FIG. 1c. Alternatively, the auxiliary electrode layer 120 may have a mesh shape or a stripe shape. However the shape of the auxiliary electrode layer 120 is not limited to these examples.

Referring to FIG. 1d, a photovoltaic layer 130 is formed within the trenches 101, 102, 103 and 104, on the first electrode layer 110 and on the auxiliary electrode layer 120.

The photovoltaic layer 130 is made of a photovoltaic material. The photovoltaic layer 130 may be made of material in which electric current is generated by sunlight incident on the material. For example, the photovoltaic layer 130 may be made of one of a silicon based photovoltaic material, a compound based photovoltaic material, an organic based photovoltaic material and a dry dye sensitized based photovoltaic material. A solar cell using the silicon based photovoltaic material among these materials mentioned above includes one of an amorphous silicon(a-Si:H) single junction solar cell, an a-Si:H/a-Si:H, a-Si:H/a-Si:H/a-Si:H multi-junction solar cell, an amorphous silicon-germanium(a-SiGe:H) single junction solar cell, an a-Si:H/a-SiGe:H double junction solar cell, an a-Si:H/a-SiGe:H/a-SiGe:H triple junction solar cell and an amorphous silicon/microcrystalline (poly crystalline) silicon double junction solar cell.

In the case of a multi junction cell, to improve the efficiency of a thin-film solar cell, an intermediate layer 135 may be formed between cells constituting the multi junction cell. In this case, the intermediate layer 135 may be made of an insulation material or a conductive material. A transparent material may be also used as the material of the intermediate layer 135. For example, the intermediate layer 135 may include at least one of a silicon nitride, a silicon oxide, a silicon carbide and a metal oxide. The intermediate layer 135 may also include at least one of metal oxide based materials such as a zinc oxide (ZnO), a tin oxide (SnO2) and an indium tin oxide (ITO).

The photovoltaic layer 130 mentioned above can be also applied to the following embodiments.

Referring to FIG. 1e a second electrode layer 140 is formed by obliquely depositing (OD2) a second conductive material on the photovoltaic layer 130. When the second conductive material is obliquely deposited (OD2) at an angle of θ2, the second conductive material is deposited on the photovoltaic layer 130 due to the deposition straightness. Since the second conductive material is obliquely deposited at an angle of θ2, the second conductive material is not deposited on a portion of the photovoltaic layer 130 formed in the trenches 101, 102, 103 and 104. The second conductive material is deposited using a deposition method such as, but not limited to, an electronic beam evaporation, a thermal evaporation, a sputtering or a spray and the like. The method for depositing the second conductive material can be also applied to the following embodiments. Based on the method described in detail, the self-aligned second electrode layer 140 is formed due to the second conductive material.

The second conductive material may include at least one of a transparent conductive material, Al, Cu, Au, Ag, Zn, W, Ni and Cr. Here, the transparent conductive material may include ZnO, SnO2 or ITO. The component of the second conductive material can be applied to the following embodiments as well as the first embodiment.

The first conductive material is obliquely deposited from one side at an angle of θ1 and the second conductive material is obliquely deposited from the opposite side to the one side at an angle of θ2. Through this process, an area to be etched of the photovoltaic layer 130 is determined.

Referring to FIG. 1f the photovoltaic layer 130 is etched such that the auxiliary electrode layer 120 in the trenches 101, 102, 103 and 104 is exposed. Here, the photovoltaic layer 130 is substantially vertically etched by using the second electrode layer 140 as a mask. Here, an etching process is performed on the portion of the photovoltaic layer 130 where the second conductive material is not formed.

While it is desirable to employ a dry etching process such as a reactive ion etching (RIE), the etching method is not limited to this. Thus, the self-aligned second electrode layer 140 allows the photovoltaic layer 130 to be micro-etched without a mask.

The etching method described above can be applied to the following embodiments as well as the first embodiment.

Referring to FIG. 1g the trenches 101 and 103 are filled with an insulation material 150 that may include a metal oxide, a silicon oxide, an enamel or a compound of them. The trenches 101 and 103 may be filled by means of a printing method, an ink jet method, a jet spray method, a screen printing method, a nano imprint method or a stamping method. The reason why the trenches 101 and 103 are filled with the insulation material 150 will be described in more detail below.

Referring to FIG. 1h a conductive layer 160 is formed on the second electrode layer 140 by obliquely depositing (OD3) a third conductive material at an angle of θ3. As such, within the trenches 102 and 104 which are not filled with the insulation material, the conductive layer 160 formed by the oblique deposition of the third conductive material is connected to the auxiliary electrode layer 120 exposed by the etching of the photovoltaic layer 130. The conductive layer 160 is also formed on the insulation material 150. Then, within the trenches, the conductive layer 160 electrically connects the auxiliary electrode layer 120 formed on one unit cell (UC) area generating electricity from light among areas between the trenches 101, 102, 103 and 104 with the second electrode layer 140 formed on another unit cell (UC) area generating electricity from light. Therefore, adjacent unit cells (UCs) are electrically connected in series to each other by the conductive layer 160.

Since the adjacent unit cells (UCs) are electrically connected in series to each other within the trench, a distance between the adjacent unit cells (UCs) may be formed from several μm to several tens of μm. That is, the ineffective area is reduced.

The above-mentioned method makes it possible to reduce the ineffective area to from several tenths to several hundredths of those of both an existing chemical evaporation process using plasma and a laser patterning using a laser beam, thereby maximizing the effective area of the photovoltaic device.

In this case, the smaller the distance between the trenches 101 and 103, which are filled with the insulation material 150, and the trenches 102 and 104, which are not filled with the insulation material 150, the smaller the ineffective area generating no electric current is.

The third conductive material may be deposited using the same deposition method as that of the second conductive material. The third conductive material may include at least one of a transparent conductive material, Al, Cu, Au, Ag, Zn, W, Ni and Cr. Here, the transparent conductive material may include ZnO, SnO2 or ITO.

The deposition method and material of the third conductive material can be applied to the description of the following embodiments.

When the trenches 101 and 103 are filled with the insulation material 150, a short-circuit between the intermediate layer 135 and the second electrode layer 140 can be prevented. Conversely and unlike FIG. 1h when the trenches 101 and 103 are not filled with the insulation material 150, the first electrode layer 110 and the second electrode layer 140 which are formed in the trenches 101 and 103 are electrically connected in series to each other by the conductive layer 160. In such a case, an area "R2" as well as an area "R1" functions as a solar cell. The solar cell of the area "R2" is electrically connected in series to the solar cell of the area "R1".

Since the area "R2" is smaller than the area "R1", electric current generated from the solar cell of the area "R2" is less than that of the area "R1". Electric current flowing through the in-series electrically connected solar cells of the area "R1" and the area "R2" is determined by electric current generated from the solar cell of the area "R2". As a result, the solar cell of the area "R2" reduces the efficiency of the overall solar cell. However, as described in the first embodiment of the present invention, when the trenches 101 and 103 are filled with the insulation material 150, the area "R2" does not function as a solar cell. Therefore, the efficiency of the overall solar cell is not deteriorated.

Referring to FIG. 1i adjacent trenches in a certain area of the substrate 100 of an integrated photovoltaic device are formed as a bus bar area. An interval between the adjacent trenches 105 and 106 corresponding to the bus bar area may be less than an interval between adjacent trenches corresponding to the effective area which is not the bus bar area. In other words, since the bus bar area does not generate electricity, the interval between the trenches of the bus bar area may be less than the interval between the trenches of the solar cell area generating electricity.

In the first embodiment of the present invention, an area between an outermost trench 106 of the substrate 100 and a trench 105 adjacent to the outermost trench 106 corresponds to a bus bar area. The bus bar area may be between 3 mm and 5 mm. The aforementioned process of FIGS. 1a to 1f is applied to the trenches 105 and 106 of the bus bar area. The width of the bus bar area may be changed according to the unit cell area.

Referring to FIG. 1i when the trenches 105 and 106 are filled with a conductive paste 170, a bus bar (not shown) like a conductive tape is adhered to the conductive paste 170, so that electric current generated by the photovoltaic layer 130 flows through the bus bar to the outside.

The above-mentioned bus bar efficiently supplies electric power generated from the integrated thin-film solar cell to the outside. Since the bus bar area changes based on the number of the trenches, it is possible to cope with various widths of the bus bar and to also increase the adhesive strength between the bus bar and the conductive paste.

The conductive paste may include at least one of Al, Cu, Au, Ag, Zn W, Ni and Cr. A printing method, an ink jet method, a jet spray method, a screen printing method, a nano imprint method or a stamping method and the like is used for filling the trenches with the conductive paste.

Such a method makes it possible to directly form a patterned bus bar area at a low temperature without an etching process according to a mask work. The method of the embodiment has a simple process and does not require expensive equipments, thereby reducing the manufacturing cost. When the bus bar area is formed according to the embodiment, a laser patterning process is not separately required for forming the bus bar. Therefore it is possible to rapidly and simply form the bus bar area.

Alternatively, the bus bar (not shown) may be directly formed on the bus bar area by using an ultrasonic adhering process instead of the conductive paste.

The characteristic of the bus bar area can be commonly applied to the description of the following embodiments.

Referring to FIG. 1j, a short-circuit preventing layer 180 may be formed after the second electrode layer 140 is formed and before the photovoltaic layer 130 is etched. The short-circuit preventing layer 180 prevents the electrode layers 110, 120 and 140 from being short-circuited.

Turning back to FIGS. 1e and 1f when an etching process is performed by using the self-aligned second electrode layer 140 as a mask, a short-circuit may occur between the end of the second electrode layer 140 and either the first electrode layer 110 or the auxiliary electrode layer 120.

In order to prevent the short-circuit mentioned above, as shown in FIG. 1j, a short-circuit preventing material is obliquely deposited at an angle of θ4 on the photovoltaic layer 130 and the second electrode layer 140 from the opposite side to one side of the substrate 100 on which the second conductive material of FIG. 1e is deposited, forming the short-circuit preventing layer 180. Since the short-circuit preventing layer 180 covers the ends of the second electrode layer 140, it is possible to prevent the short-circuit between the end of the second electrode layer 140 and either the first electrode layer 110 or the auxiliary electrode layer 120. The aforementioned function of the short-circuit preventing layer 180 can be also applied to the following embodiments.

Referring to FIG. 1k the photovoltaic layer 130 is etched such that the auxiliary electrode layer 120 is exposed by the short-circuit preventing layer 180 and the self-aligned second electrode layer 140.

Here, since the etched area is smaller than the etched area shown in FIG. 1f and the short-circuit preventing layer 180 covers the end of the second electrode layer 140, it is possible to prevent the short-circuit between the end of the second electrode layer 140 and the first electrode layer 110 or between the end of the second electrode layer 140 and the auxiliary electrode layer 120. The short-circuit preventing layer 180 may be formed of the same material as that of the second electrode layer 140.

Referring to FIG. 1l the trench 101 is filled with the insulation material 150. Referring to FIG. 1m, the conductive layer 160 is formed. Referring to FIG. 1n the bus bar area is formed and the trench of the bus bar area is filled with the conductive paste 170.

As described above, the first electrode layer 110, the photovoltaic layer 130, the second electrode layer 140, the etched photovoltaic layer, the short-circuit preventing layer 180 and the conductive layer 160 are formed without a separate mask process. Accordingly, the production process of the photovoltaic device becomes simple and a time required for producing thereof may be reduced.

Figure 2A:
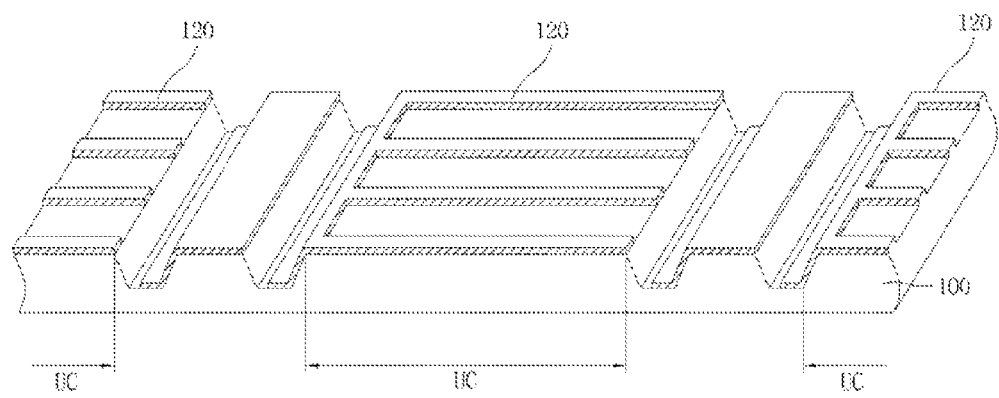
FIGS. 2a to 2n show a method for manufacturing a photovoltaic device according to a second embodiment of the present invention.
Figure 2B:
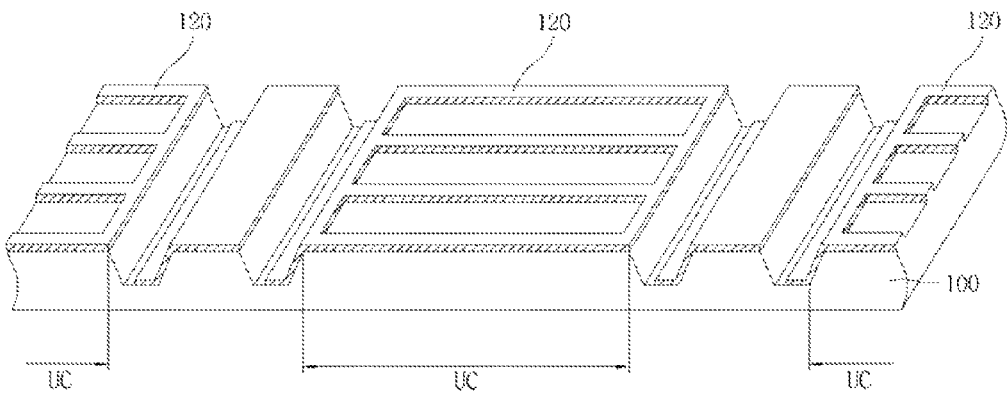
Figure 2C:
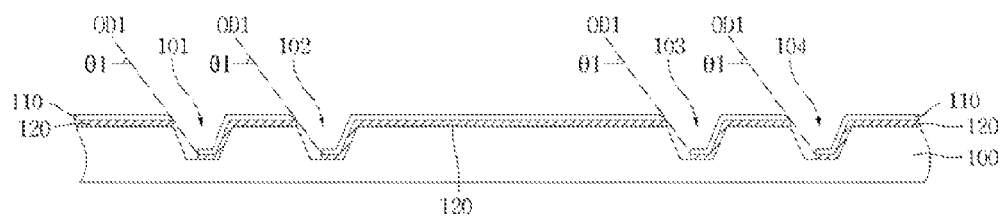
Figure 2D:
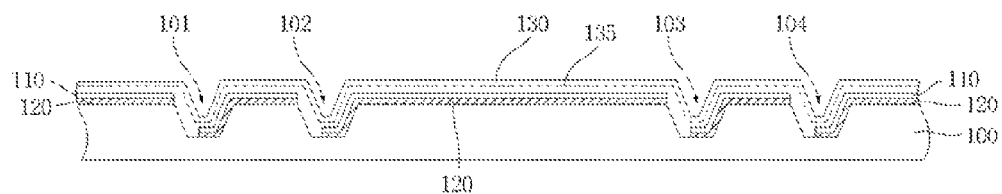
Figure 2E:
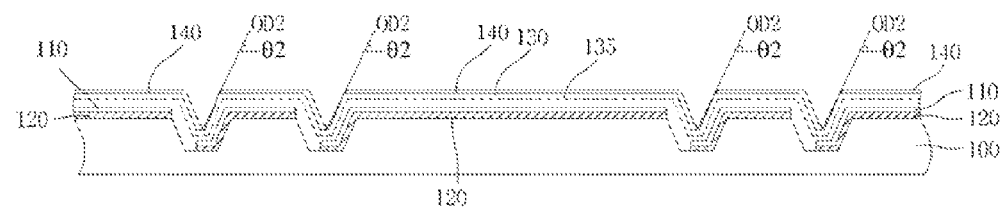
Figure 2F:
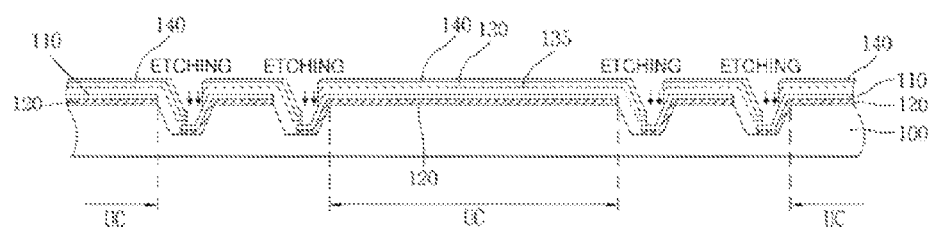
Figure 2G:
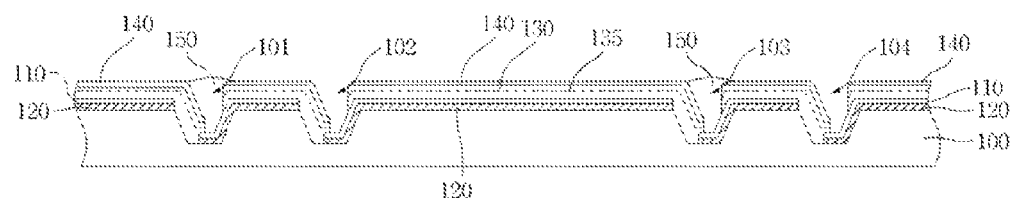
Figure 2H:
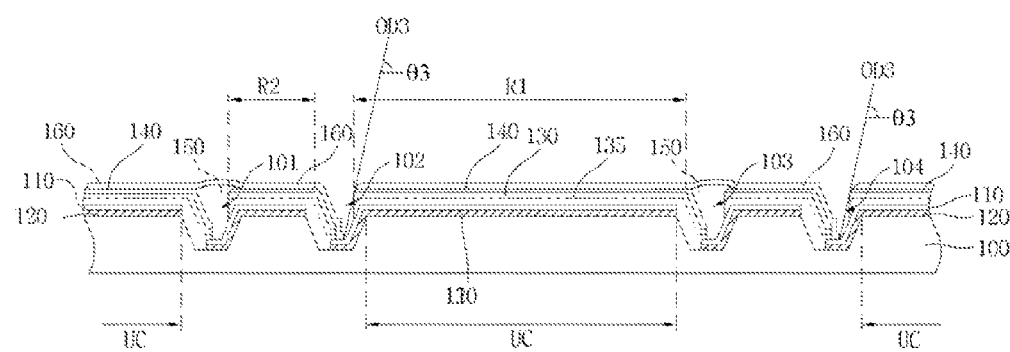
Figure 2I:
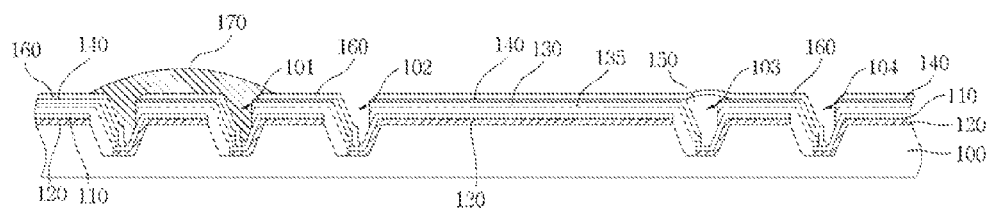
Figure 2J:
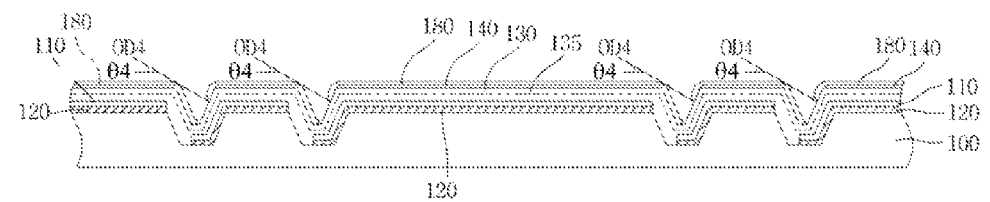
Figure 2K:
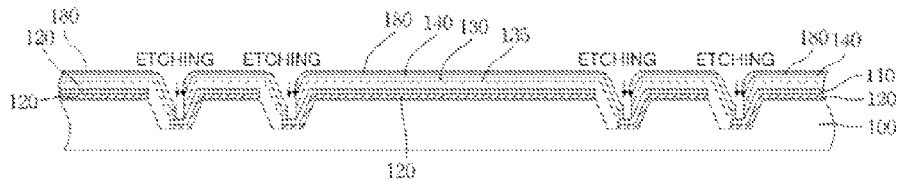
Figure 2L:
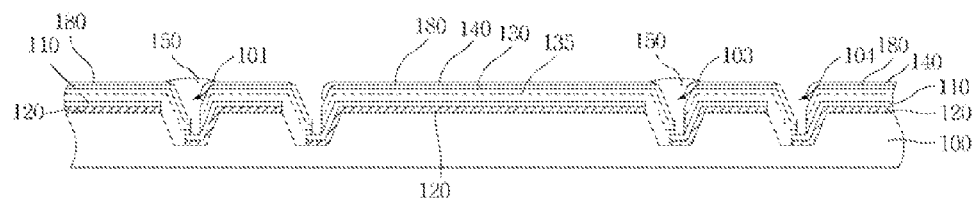
Figure 2M:
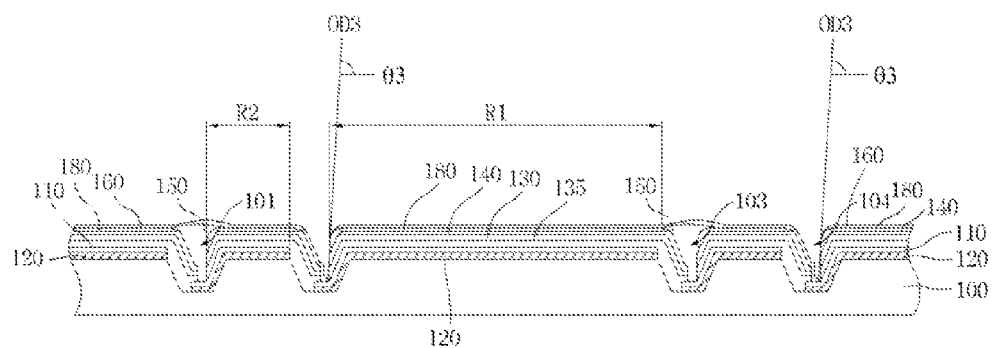
Figure 2N:
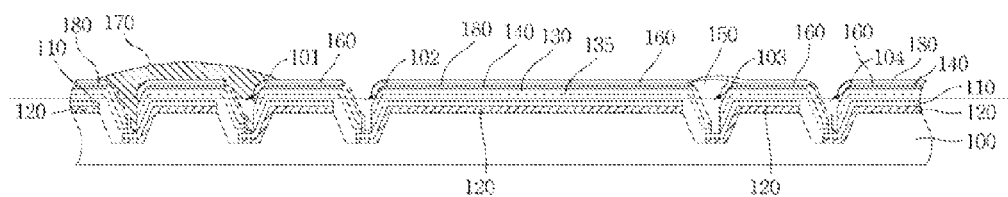

FIGS. 2a to 2n show a method for manufacturing a photovoltaic device according to a second embodiment of the present invention.

Referring to FIGS. 2a to 2c, in the second embodiment, unlike the first embodiment, the auxiliary electrode layer 120 is formed on the substrate 100 prior to the first electrode layer 110. Since the first electrode layer 110 is located on the auxiliary electrode layer 120, the first electrode layer 110 is exposed when the photovoltaic layer 130 is etched. The conductive layer 160 is connected to the first electrode layer 110 located on the auxiliary electrode layer 120.

The formation of the photovoltaic layer 130 shown in FIG. 2d, the formation of the second electrode layer 140 shown in FIG. 2e, the etching of the photovoltaic layer 130 shown in FIGS. 2f and 2k, the filling with the insulation material 150 shown in FIGS. 2g and 2l the formation of the conductive layer 160 shown FIGS. 2h and 2m, the formation of the bus bar area shown in FIGS. 2i and 2n and the formation of the short-circuit preventing layer 180 shown in FIG. 2j have been already described in the first embodiment, the detailed description thereof will be omitted.

Since the auxiliary electrode layer 120 is formed on the substrate 100 prior to the first electrode layer 110, the first electrode layer 110 is exposed within the trenches 101, 102, 103 and 104 when the photovoltaic layer 130 is etched. The conductive layer 160 is connected to the first electrode layer 110 within the trenches 101, 102, 103 and 104.

As a result, the conductive layer 160 electrically connects within the trenches the first electrode layer 110 formed on one unit cell (UC) area generating electricity from light among areas between the trenches 101, 102 103 and 104 with the second electrode layer 140 formed on another unit cell (UC) area generating electricity from light.

Here, the auxiliary electrode layer 120 may be in direct contact with the conductive layer 160 in order to reduce the electrical resistance. To this end, as shown in FIG. 2c, the first electrode layer 110 may be formed by depositing the first conductive material by an oblique deposition angle less than θ1, so that the end of the auxiliary electrode layer 120 within the trench can be exposed.

The aforementioned characteristic can be commonly applied to the fourth, sixth and eighth embodiments of the present invention. Though not shown, after the auxiliary electrode layer 120 having a ladder shape is formed, the first electrode layers 110 may be formed on the substrate 100 of the unit cell (UC) area exposed by not forming the first electrode layer 110 on the auxiliary electrode layer 120 and not superposing the auxiliary electrode layer 120 having a ladder shape on the substrate 100. That is, the first electrode layer 110 may be formed inside the ladder shape. As described above, as the first electrode layer 110 is formed, a lateral surface of the auxiliary electrode layer 120 is in contact with and electrically connected to a lateral surface of the first electrode layer 110.

The aforementioned characteristic can be commonly applied to the fourth, sixth and eighth embodiments of the present invention.

FIGS. 3a to 3j show a method for manufacturing a photovoltaic device according to a third embodiment of the present invention.

Figure 3A:
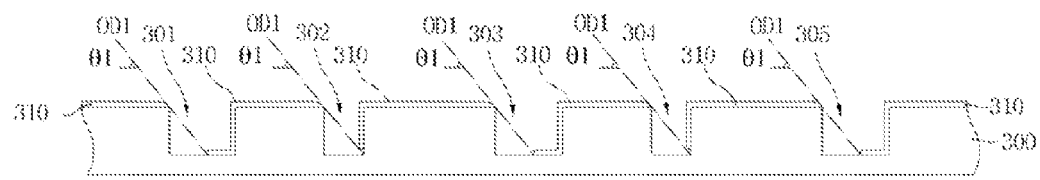
FIGS. 3a to 3j show a method for manufacturing a photovoltaic device according to a third embodiment of the present invention.

Referring to FIG. 3a, a substrate 300 is provided having trenches 301, 303 and 305 formed therein and grooves 302 and 304 formed between adjacent trenches 301 and 303, and between adjacent trenches 303 and 305. The grooves 302 and 304 are areas through which sunlight is transmitted. Meanwhile, the trenches 301, 303 and 305 and the grooves 302 and 304 may be formed by using the same method as that of forming the trench in the first embodiment. While the drawing shows that the grooves 302 and 304 do not penetrate the substrate 300, the grooves 302 and 304 may penetrate the substrate 300. Accordingly, light is more easily transmitted through the grooves 302 and 304.

In the third embodiment of the present invention, it is possible either to use the substrate 300 in which the trenches 301, 303 and 305 and the grooves 302 and 304 have been already formed or to include forming the trenches 301, 303 and 305 and the grooves 302 and 304 on the substrate 300. The trenches 301, 303 and 305 may be formed simultaneously with the grooves 302 and 304.

The ratio of depth to width of the groove 302 and 304 or the ratio of depth to diameter of the grooves 302 and 304 may be greater than the ratio of depth to width of the trenches 301, 303 and 305. For example, as shown in FIG. 3a, the width of the grooves 302 and 304 is less than that of the trenches 301, 303 and 305, and the depth of the grooves 302 and 304 is equal to that of the trenches 301, 303 and 305. Though not shown, the depth of the grooves 302 and 304 may be greater than that of the trenches 301, 303 and 305, and the width of the grooves 302 and 304 may be equal to that of the trenches 301, 303 and 305. This intends that a first, a second and a third conductive materials are subsequently obliquely deposited in order that the first, the second and the third conductive materials are not deposited on the bottom surfaces of the grooves 302 and 304. As a result, it is not necessary to perform an etching process for removing the first, the second and the third conductive materials on the bottom surfaces of the grooves 302 and 304. Thus, in the subsequent process, when a photovoltaic layer formed on the bottom surfaces of the grooves 302 and 304 is etched, light is able to transmit through the bottom surfaces of the grooves 302 and 304.

Referring to FIG. 3a, the first conductive material is obliquely deposited (OD1) from one side of the substrate 300, so that a first electrode layer 310 is formed on the substrate 300. When the first conductive material is obliquely deposited at an angle of θ1, deposition straightness causes the first conductive material to be deposited on the substrate 300. The first conductive material is not deposited on the bottom surfaces of the grooves 302 and 304 and on the portions of the trenches 301, 303 and 305 by the oblique deposition.

The groove 302 and 304 may have a circular, polygonal or elliptical shape.

Figure 3B:
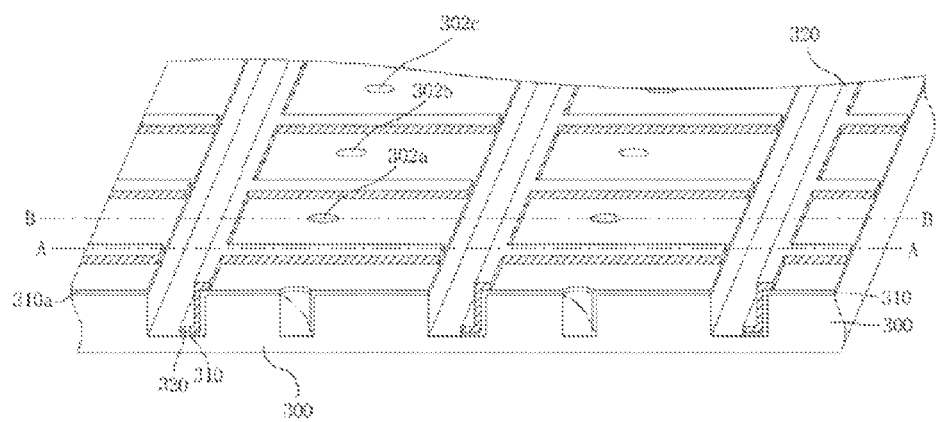
Figure 3C:
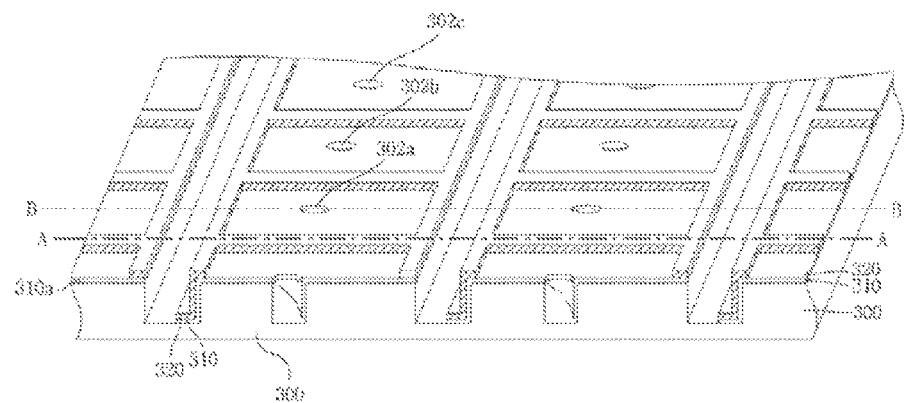

Referring to FIG. 3b, an auxiliary electrode layer 320 is formed-on a portion of the area of the first electrode layer 310. The auxiliary electrode layer 320 has an electrical resistance less than that of the first electrode layer 310. Since the function and effect of the auxiliary electrode layer 320 have been already described in the first embodiment, the description thereof will be emitted. Grooves 302a 302b and 302c are located between the adjacent trenches 301 and 303, and between the adjacent trenches 303 and 305. The auxiliary electrode layer 320 is formed between the grooves 302a and 302b so as not to be obstructive to the light transmission through the grooves 302 and 304.

The auxiliary electrode layer 320 functions to reduce the electrical resistance of the first electrode layer 310 and has a shape capable of reducing the shadow effect thereof and allowing light to be easily transmitted. For example, the shape of the auxiliary electrode layer 320 may be, but not limited to, a fork of FIG. 3b or a ladder of FIG. 3c.

Figure 3D:
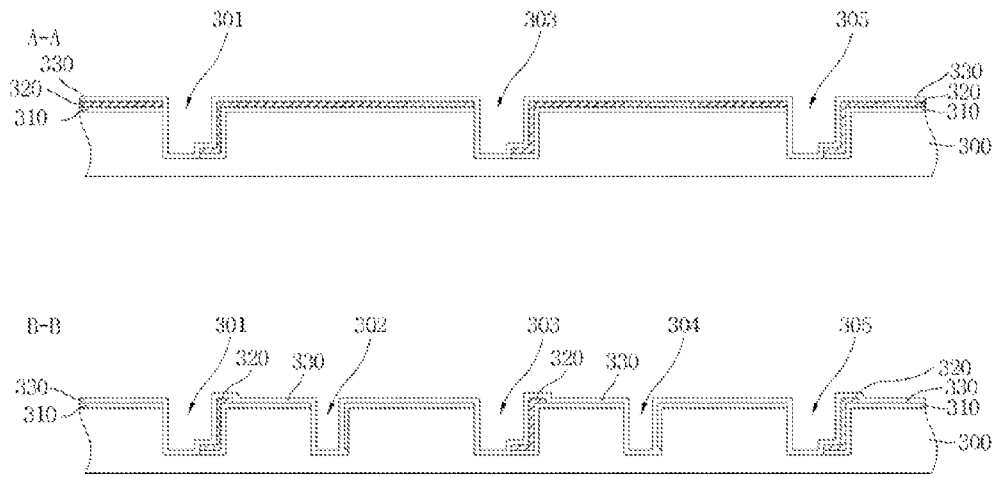

As described above, because the auxiliary electrode layer 320 is formed between the grooves 302a and 302ba cross-section taken along line "A-A" is different from a cross-section taken along line "B-B". Accordingly, as shown in FIG. 3d, the cross-section taken along line "A-A" shows that a photovoltaic layer 330 is formed within the trenches 301, 303 and 305 and on the first electrode layer 310 and the auxiliary electrode layer 320. The cross-section taken along line "B-B" shows that a photovoltaic layer 330 is formed within the trenches 301, 303 and 305 and the grooves 302 and 304, and on the first electrode layer 310 and the auxiliary electrode layer 320.

Figure 3E:
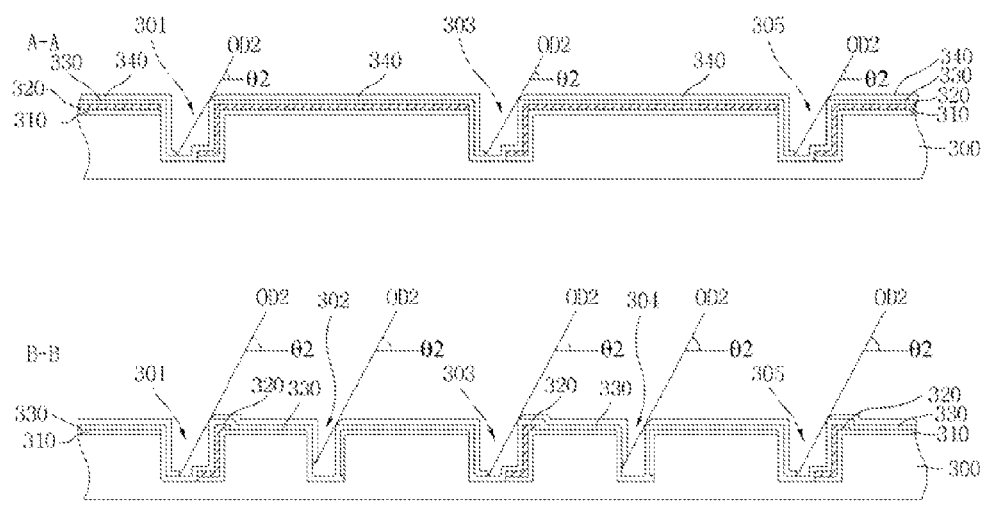

Referring to FIG. 3e, a second electrode layer 340 is termed by obliquely depositing (OD2) the second conductive material on the photovoltaic layer 330 from the opposite side to the one side. When the second conductive material is obliquely deposited (OD2) at an angle of θ2, the second conductive material is deposited on the photovoltaic layer 330 due to the deposition straightness. The second conductive material is not deposited on a portion of the photovoltaic layer 330 formed on the trenches 301, 303 and 305 and on the grooves 302 and 304 by an angle of θ2 and by the trenches 301, 303 and 305 formed on the substrate 300.

Figure 3F:
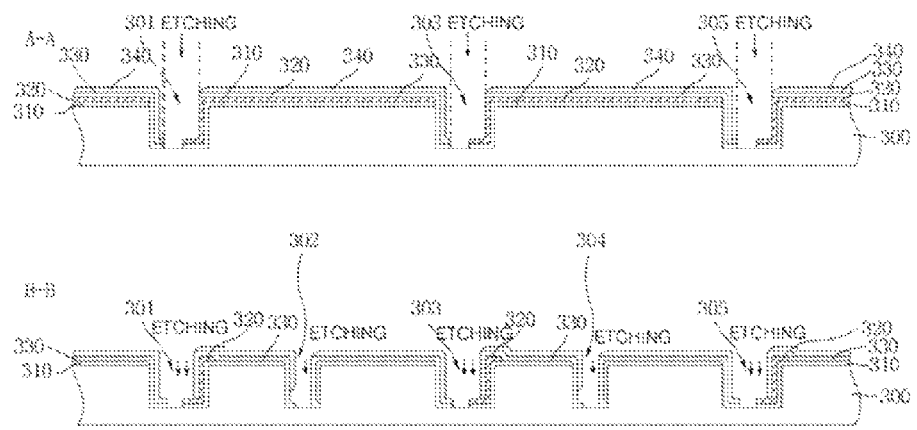

Referring to FIG. 3f, the photovoltaic layer 330 formed in the trenches 301, 303 and 305 is etched such that the auxiliary electrode layer 320 within the trenches 301, 303 and 305 is exposed. The photovoltaic layer 330 formed in the grooves 302 and 304 is etched such that light is transmitted through the grooves 302 and 304.

The self-aligned second electrode layer 340 is used as a mask for etching the photovoltaic layer 330, so that the photovoltaic layer 330 is substantially vertically etched. Here, an etching process is performed on a portion of the photovoltaic layer 530 on the bottom surfaces of the trenches 301, 303 and 305 and the grooves 302 and 304 on which the second conductive material has not been formed. Thus, since the self-aligned second electrode layer 340 is used as a mask, a separate mask is not required.

The photovoltaic layer formed on the trenches 301, 303 and 305 may be etched actually simultaneously with or separately from the photovoltaic layer formed on the grooves 302 and 304. When the photovoltaic layer is etched, the bottom surfaces of the grooves 302 and 304 are exposed, so that light is transmitted through the bottom surface of the groove.

Figure 3G:
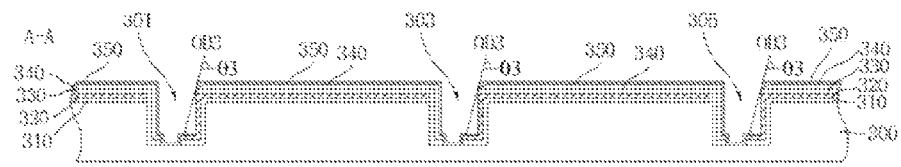
Figure 3G:
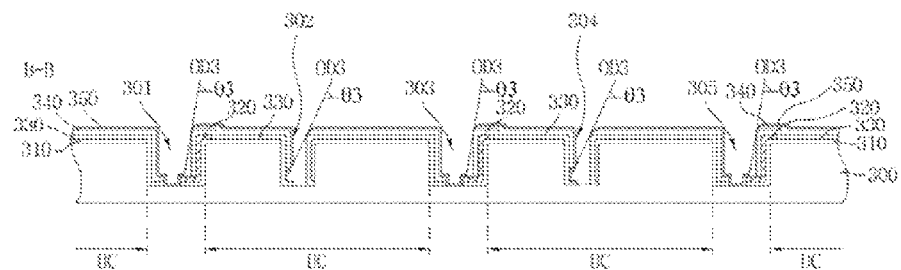

Referring to FIG. 3g, the third conductive material is obliquely deposited (OD3) on the second electrode layer 340, so that a third conductive layer 350 is formed such that the auxiliary electrode layer 320 formed on one unit cell (UC) area is electrically connected in series to the second electrode layer 340 formed on another unit cell (UC) area adjacent to the one unit cell (UC) area. The auxiliary electrode 320 within the trench is connected to the conductive layer 350.

The third conductive material may be deposited by using the same deposition method as that of the second conductive material. That is, when the third conductive material is obliquely deposited at an angle of θ3, the deposition straightness causes the third conductive material to be deposited on the auxiliary electrode layer 320 of the trenches 301, 303 and 305 exposed by the etching of the photovoltaic layer 330. As a result, the third conductive layer 350 is formed. Here, the third conductive material is not deposited on the bottom surfaces of the grooves 302 and 304.

Within the trenches 301, 303 and 305, the auxiliary electrode layer 320 formed on one unit cell (UC) area is connected to the conductive layer 350 formed on the second electrode layer 340 of another unit cell (UC) adjacent to the one unit cell (UC). Therefore, the unit cells (UCs) are electrically connected in series to each other.

Figure 3H:
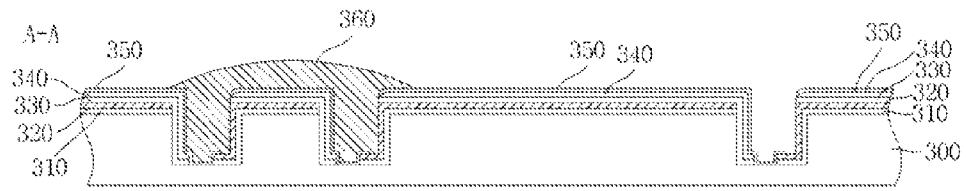

Referring to FIG. 3h, the adjacent trenches in a certain area of the substrate 300 of the integrated photovoltaic device are formed as a bus bar area. Since the bus bar area and a conductive paste have been already described in the first embodiment, the detailed description thereof will be omitted.

Figure 3I:
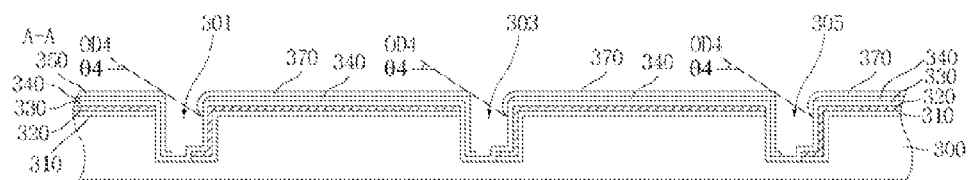

Referring to FIG. 3i, after the second electrode layer 340 is formed and before the photovoltaic layer 330 is etched, a short-circuit preventing layer 370 may be formed for preventing a short-circuit of the electrode layers 310, 320 and 340.

Turning back to FIGS. 3e and 3f, when an etching process is performed by using the self-aligned second electrode layer 340 as a mask, a short-circuit may occur between the end of the second electrode layer 340 and either the first electrode layer 310 or the auxiliary electrode layer 320.

In order to prevent the short-circuit mentioned above, as shown in FIG. 3i, a short-circuit preventing material is obliquely deposited at an angle of θ4 on the photovoltaic layer 330 and the second electrode layer 340 from the opposite side to one side from which the second conductive material is emitted.

Figure 3J:
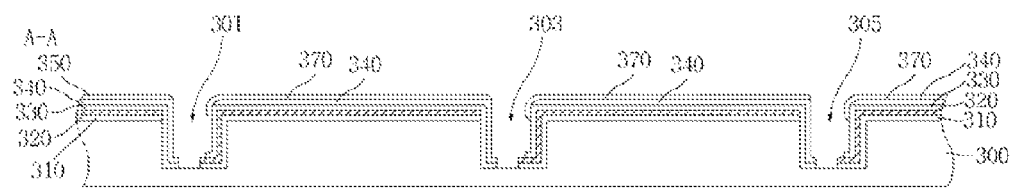

Referring to FIG. 3j, the photovoltaic layer 330 is etched such that the auxiliary electrode layer 320 is exposed by the short-circuit preventing layer 370 and the self-aligned second electrode layer 340. Here, since the etched area is smaller than the etched area of FIG. 3f and the short-circuit preventing layer 370 covers the end of the second electrode layer 340, it is possible to prevent the short-circuit between the end of the second electrode layer 340 and the first electrode layer 310 or between the end of the second electrode layer 340 and the auxiliary electrode layer 320. The short-circuit preventing layer 370 may be formed of the same material as that of the second electrode layer 340.

After the photovoltaic layer 330 is etched, the conductive layer 350 is formed on the second electrode layer 340 so as to come in contact with the auxiliary electrode layer 320 of the trenches 301, 303 and 305. The unit cells are electrically connected in series to each other.

FIGS. 4a to 4j show a method for manufacturing a photovoltaic device according to a fourth embodiment of the present invention.

Figure 4A:
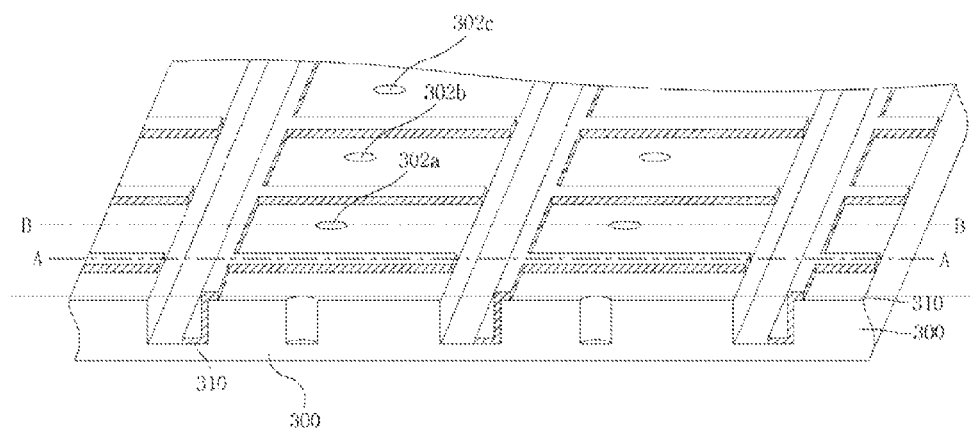
FIGS. 4a to 4j show a method for manufacturing a photovoltaic device according to a fourth embodiment of the present invention.
Figure 4B:
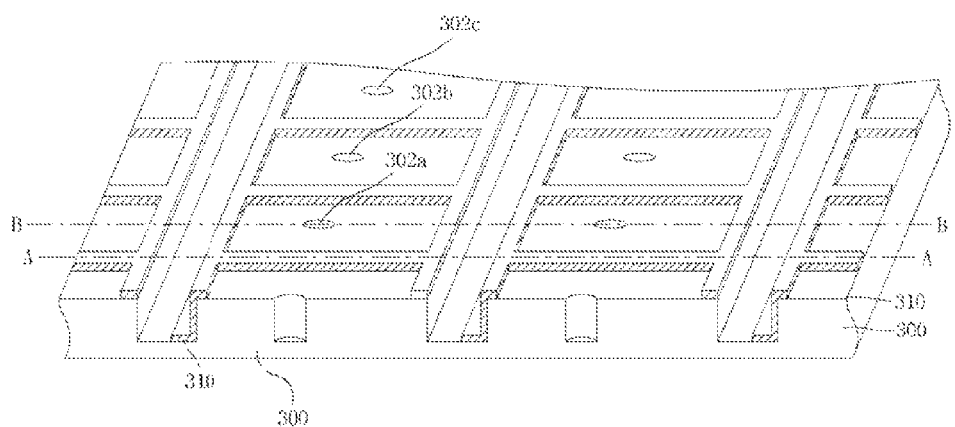
Figure 4C:
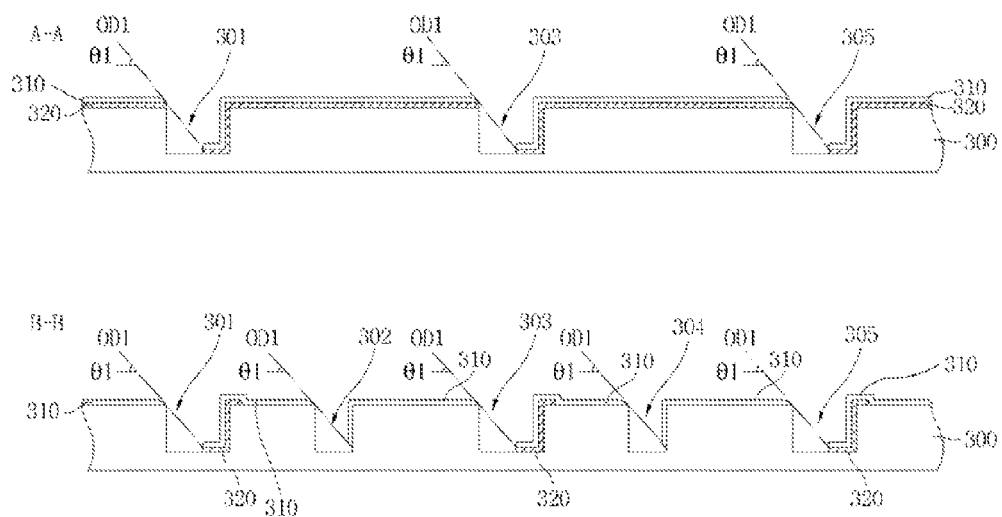

Referring to FIGS. 4a to 4c, in the fourth embodiment, unlike the third embodiment, the auxiliary electrode layer 320 is formed on the substrate 300 prior to the formation of the first electrode layer 310. Since the first electrode layer 310 is located on the auxiliary electrode layer 320, the first electrode layer 310 is exposed when the photovoltaic layer 330 is etched. The conductive layer 350 is connected to the first electrode layer 310 located on the auxiliary electrode layer 320.

Figure 4D:
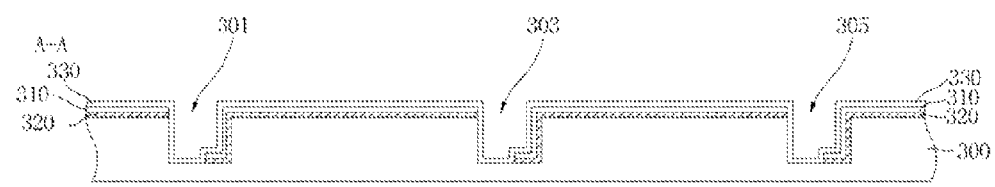
Figure 4D:
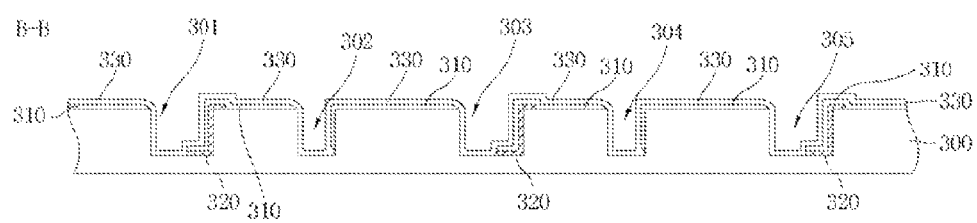
Figure 4E:
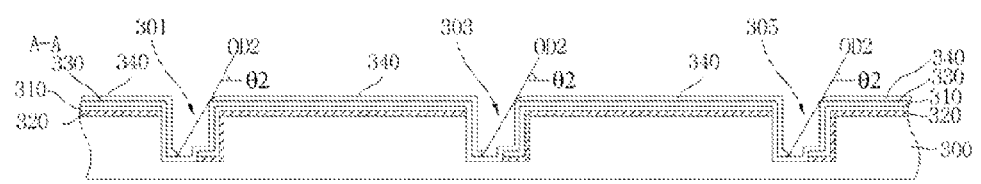
Figure 4E:
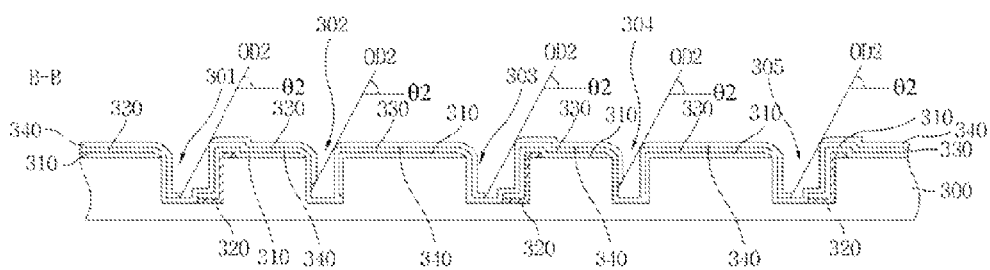
Figure 4F:
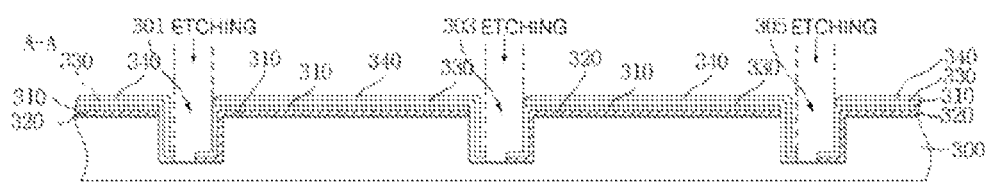
Figure 4F:
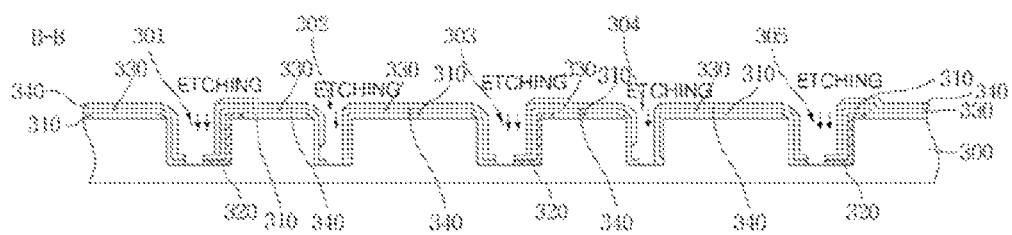
Figure 4G:
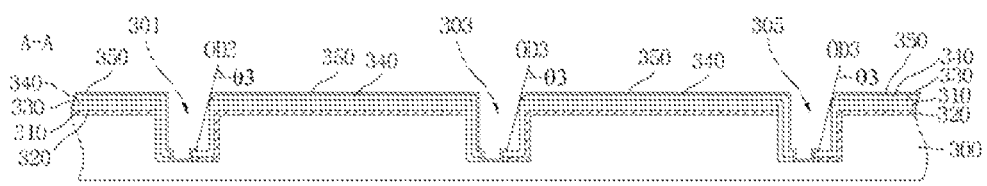
Figure 4G:
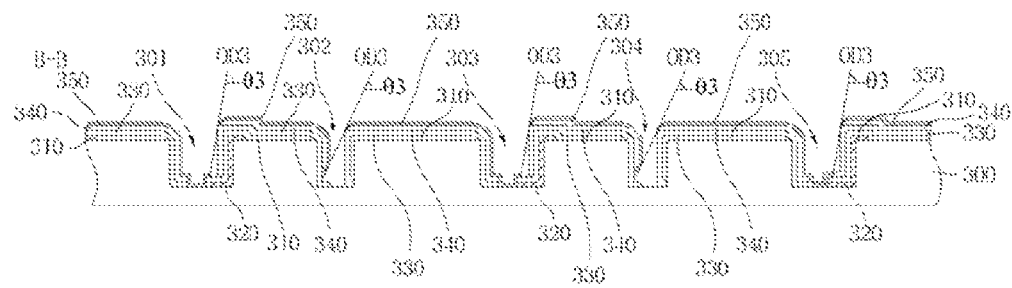
Figure 4H:
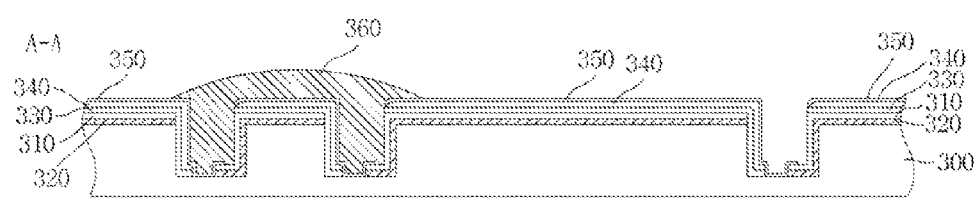
Figure 4I:
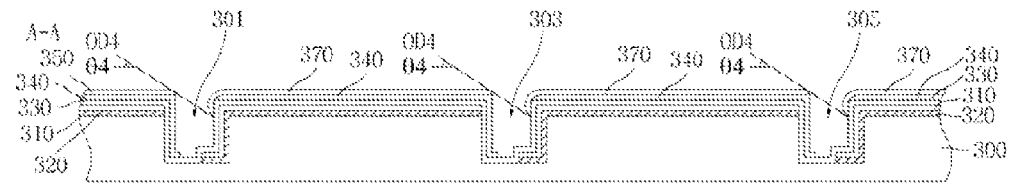
Figure 4J:
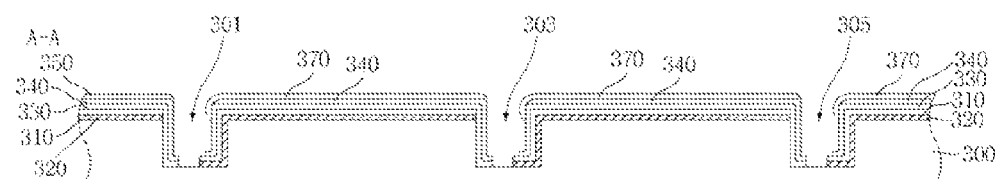

Since the formation of the photovoltaic layer 330 of FIG. 4d, the formation of the second electrode layer 340 of FIG. 4e, the etching of the photovoltaic layer 330 of FIGS. 4f and 4j, the formation of the conductive layer 350 of FIG. 4g, the formation of the bus bar area of FIG. 4h and the formation of the short-circuit preventing layer 370 of FIGS. 4i and 4j have been already described in the third embodiment, the detailed description thereof will be omitted.

Since the auxiliary electrode layer 320 is formed on the substrate 300 prior to the first electrode layer 310, the first electrode layer 310 is exposed within the trenches 301, 303 and 305 when the photovoltaic layer 330 is etched. The conductive layer 350 is connected to the first electrode layer 310 within the trenches 301, 303 and 305.

The processes of the third and the fourth embodiments are performed according to self-alignment without a position control device, thereby manufacturing the integrated photovoltaic device through a relatively simple process. The third and the fourth embodiments provide a see-through type integrated photovoltaic device. In the third and the fourth embodiments, when transparent plastic or a transparent nanocomposite material is used as the substrate 300, it is possible to manufacture a soft integrated photovoltaic device which can be applied to the window of a house or a car.

In the third and the fourth embodiments, the groove 302 which light transmits may not be necessarily formed.

FIGS. 5a to 5k show a method for manufacturing a photovoltaic device according to a fifth embodiment of the present invention.

Figure 5A:
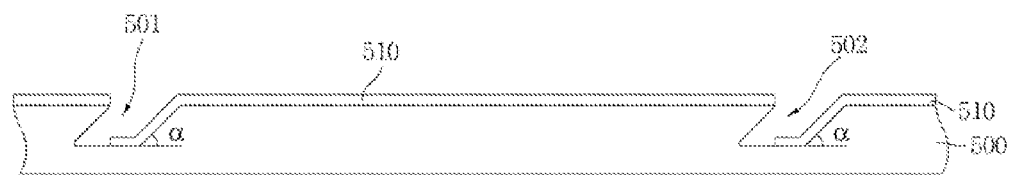
FIGS. 5a to 5k show a method for manufacturing a photovoltaic device according to a fifth embodiment of the present invention.

Referring to FIG. 5a, provided is a substrate 500 in which trenches 501 and 502 are formed separately from each other by a predetermined interval and inclined at an angle of ∠α in one direction.

Here, the sides of the trenches 501 and 502 in the fifth embodiment are inclined at an angle of ∠α in one direction with respect to the horizontal direction of the substrate 500. While the first to the fourth embodiments require an oblique deposition process for a formation of the first electrode layer, the fifth embodiment makes it possible to form a first electrode layer 510 by means of an electronic beam evaporation, a thermal evaporation, a sputtering or a spray and the like instead of the oblique deposition process.

Referring to FIG. 5a, a first conductive material is deposited on a portion of the bottom surface of and one side of each of the trenches 501 and 502 of the substrate 500, so that the first electrode layer 510 is formed. As described above, the first conductive material can be deposited on the substrate 500 by using various deposition methods such as an electronic beam evaporation, a thermal evaporation, a sputtering or a spray and the like instead of the oblique deposition process.

When the first conductive material is deposited on the substrate 500 in the vertical direction of the substrate 500, the trenches 501 and 502 inclined in one direction cause the first conductive material not to be deposited on a portion of the trenches 501 and 502.

Figure 5B:
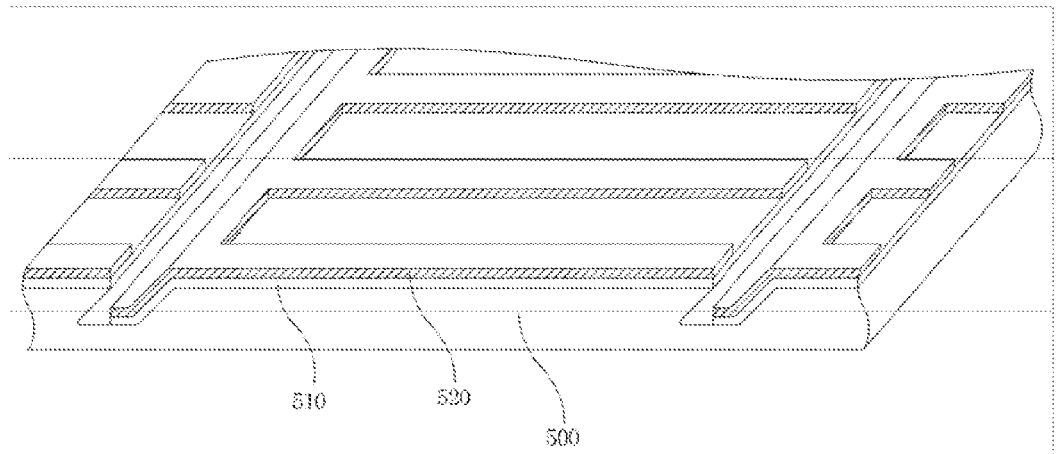
Figure 5C:
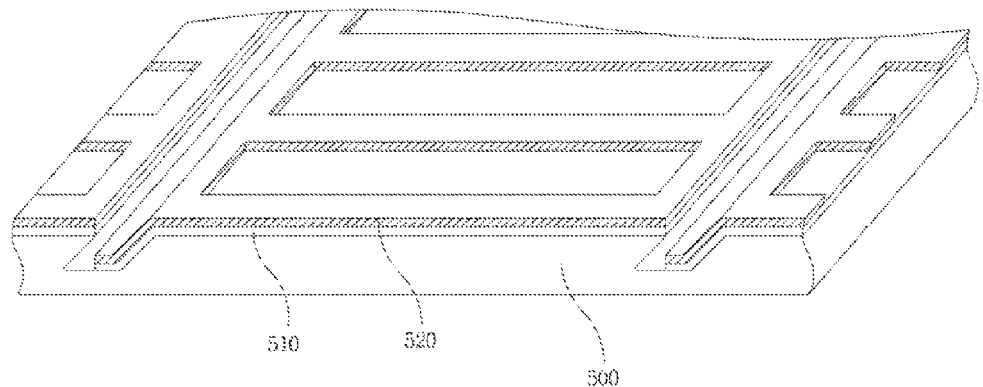

Referring to FIG. 5b, an auxiliary electrode layer 520 having an electrical resistance less than that of the first electrode 510 is formed on a portion of the area of the first electrode layer 510. The auxiliary electrode layer 520 functions to reduce the electrical resistance of the first electrode layer 510 and may have various shapes capable of allowing light to easily transmit by reducing a shadow effect caused by the auxiliary electrode layer 520. For example, the shape of the auxiliary electrode layer 520 may be a fork shape or a ladder shape as shown in FIGS. 5b and 5c. Though not shown, the auxiliary electrode layer 520 may have a mesh shape or a stripe shape.

Figure 5D:
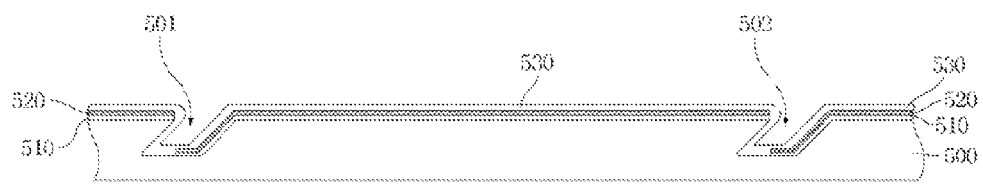

Referring to FIG. 5d, a photovoltaic layer 530 is formed in the trenches 501 and 502, and on the first electrode layer 510 and the auxiliary electrode layer 520. The photovoltaic layer 530 is made of a photovoltaic material. The photovoltaic layer 530 may be made of a material in which electric current is generated by sunlight incident on the material.

Figure 5E:
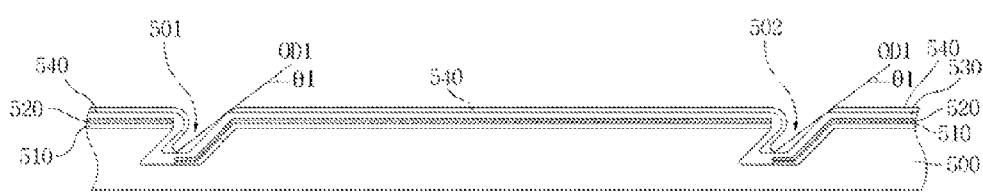

Referring to FIG. 5e, a second electrode layer 540 is formed by obliquely depositing (OD1) a second conductive material on the photovoltaic layer 530. When the second conductive material is obliquely deposited at an angle of θ1, the second conductive material is deposited on the photovoltaic layer 530 due to the deposition straightness. Since the second conductive material is obliquely deposited at an angle of θ1, the second conductive material is not deposited on a portion of the photovoltaic layer 530 formed in the trenches 501 and 502. According to the aforementioned method, the self-aligned second electrode layer 540 is formed by the second conductive material.

Figure 5F:
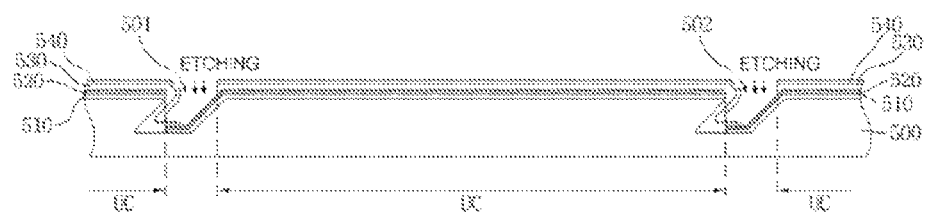

Referring to FIG. 5f, the photovoltaic layer 530 in which the trenches 501 and 502 are formed is etched such that the auxiliary electrode layer 520 within the trenches 501 and 502 is exposed. The photovoltaic layer 530 is substantially vertically etched by using the second electrode layer 540 which is self-aligned in the previous process as a mask. Here, an etching process is performed on a portion of the photovoltaic layer 530 where the second conductive material is not formed.

Figure 5G:
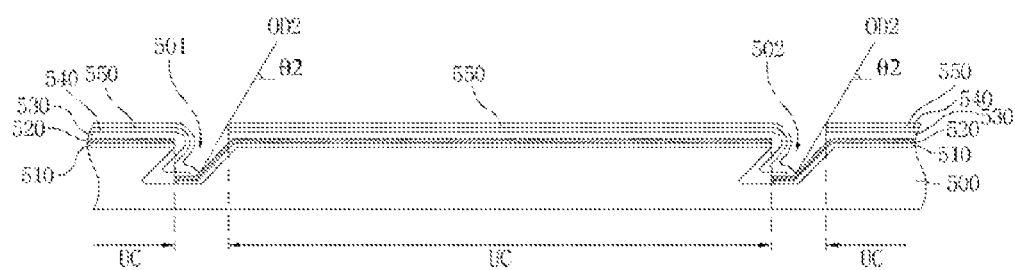

Referring to FIG. 5g, a third conductive material is obliquely deposited (OD2) at an angle of θ2, so that a conductive layer 550 is formed on the second electrode layer 540. As such, within the trenches 501 and 502, the conductive layer 550 formed by the oblique deposition of the third conductive material is connected to the auxiliary electrode layer 520 exposed by the etching of the photovoltaic layer 530. Therefore, adjacent unit cells (UCs) are electrically connected in series to each other.

The third conductive material may be deposited by using the same deposition method as that of the second conductive material. When the third conductive material is obliquely deposited, deposition straightness causes the third conductive material to be deposited on the auxiliary electrode layer 520 exposed by the etching.

Figure 5H:
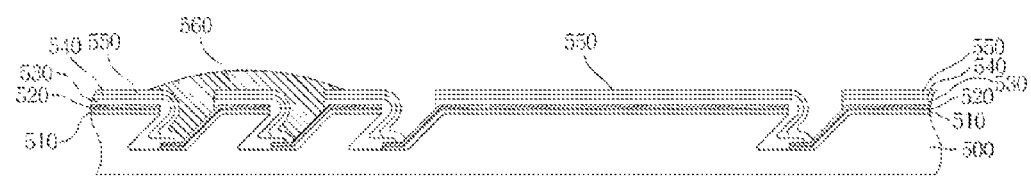

Referring to FIG. 5h, adjacent trenches in a certain area of the substrate 500 of the integrated photovoltaic device are formed as a bus bar area. The trenches of the bus bar area are filled with a conductive paste 560.

Figure 5I:
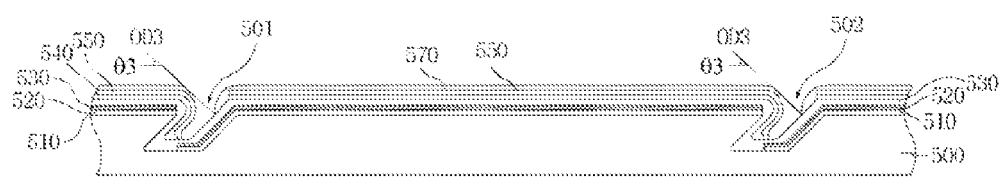

Referring to FIG. 5i, after the second electrode layer 540 is formed and before the photovoltaic layer 530 is etched, a short-circuit preventing layer 570 may be formed for preventing a short-circuit of the electrode layers 510, 520 and 540. A short-circuit preventing material is obliquely deposited at an angle of θ3 on the photovoltaic layer 530 and the second electrode layer 540 from the opposite side to one side from which the second conductive material is emitted.

Figure 5J:
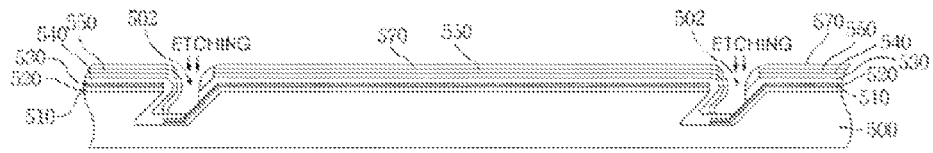

Referring to FIG. 5j, the photovoltaic layer 530 is etched such that the auxiliary electrode layer 520 is exposed by the short-circuit preventing layer 570 and the self-aligned second electrode layer 540. Here, since the etched area is smaller than the etched area of FIG. 5f and the short-circuit preventing layer 570 covers the end of the second electrode layer 540, it is possible to prevent the short-circuit between the end of the second electrode layer 540 and the first electrode layer 510 or between the end of the second electrode layer 540 and the auxiliary electrode layer 520. The short-circuit preventing layer 570 may be formed of the same material as that of the second electrode layer 540.

Figure 5K:
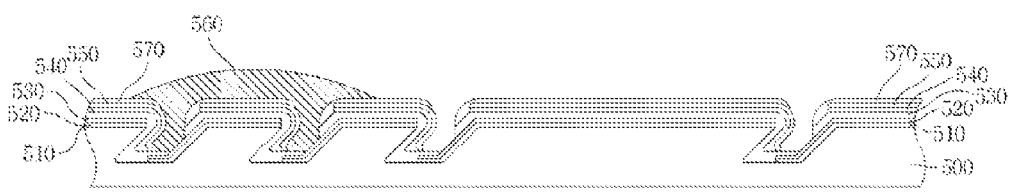

Referring to FIG. 5k, the adjacent trenches in a certain area of the substrate 500 of the integrated photovoltaic device are formed as a bus bar area. The trenches of the bus bar area are filled with a conductive paste 560.

FIGS. 6a to 6k show a method for manufacturing a photovoltaic device according to a sixth embodiment of the present invention.

Figure 6A:
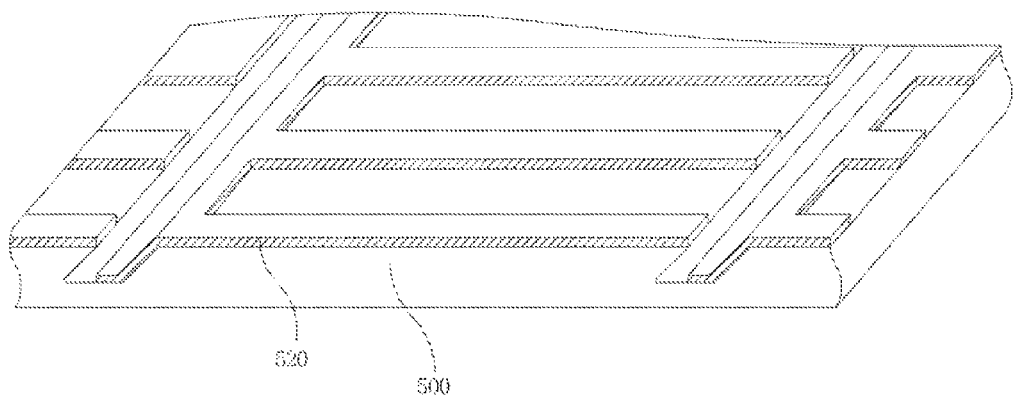
FIGS. 6a to 6k show a method for manufacturing a photovoltaic device according to a sixth embodiment of the present invention.
Figure 6B:
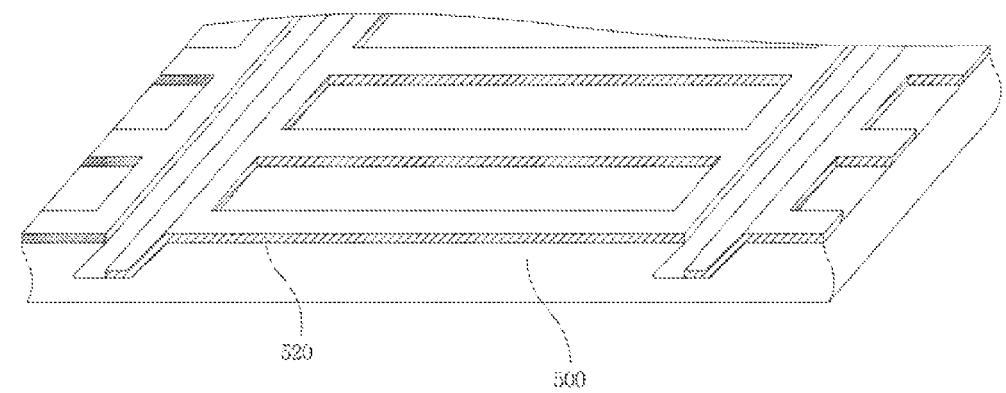
Figure 6C:
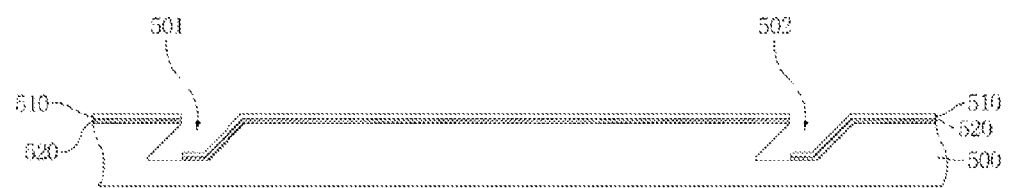

Referring to FIGS. 6a to 6c, unlike the fifth embodiment, in the sixth embodiment, the auxiliary electrode layer 520 is formed on the substrate 500 prior to a formation of the first electrode layer 510. Since the first electrode layer 510 is located on the auxiliary electrode layer 520, the first electrode layer 510 is exposed when the photovoltaic layer 530 is etched. The conductive layer 560 is connected to the first electrode layer 510 located on the auxiliary electrode layer 520.

Figure 6D:
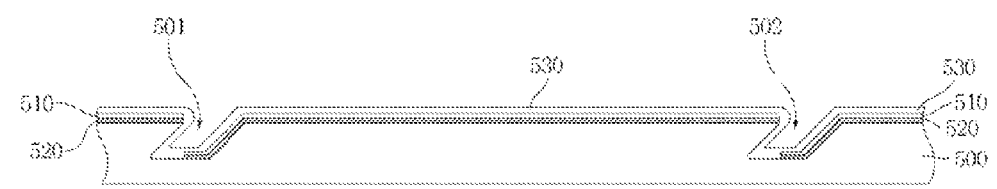
Figure 6E:
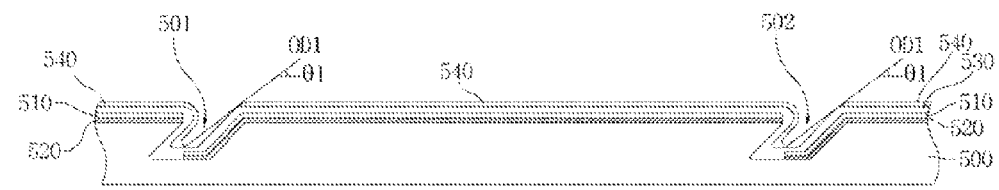
Figure 6F:
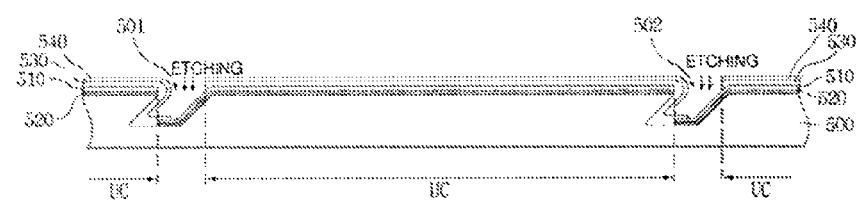
Figure 6G:
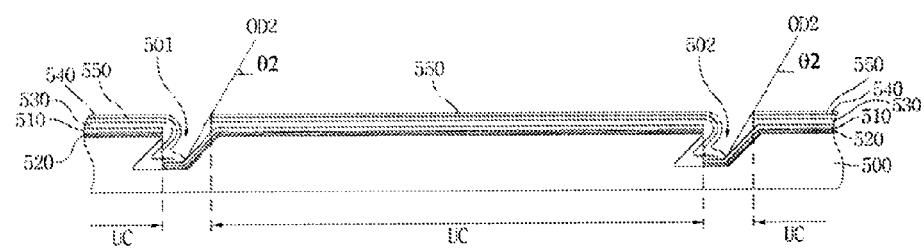
Figure 6H:
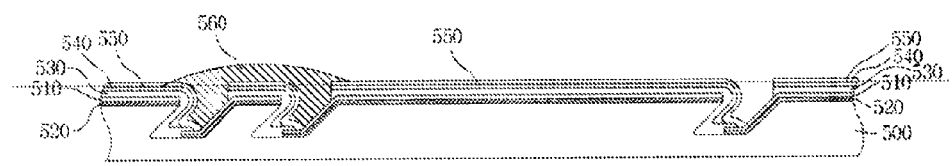
Figure 6I:
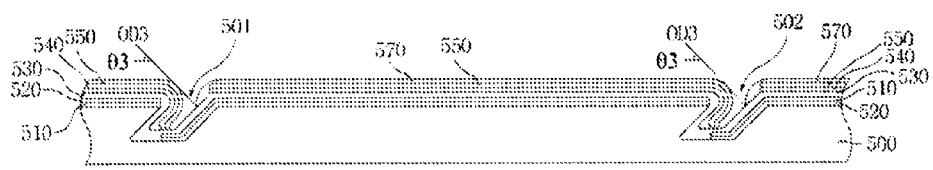
Figure 6J:
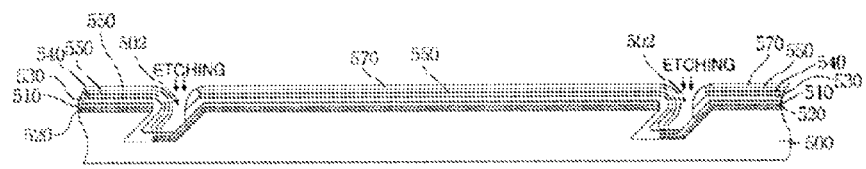
Figure 6K:
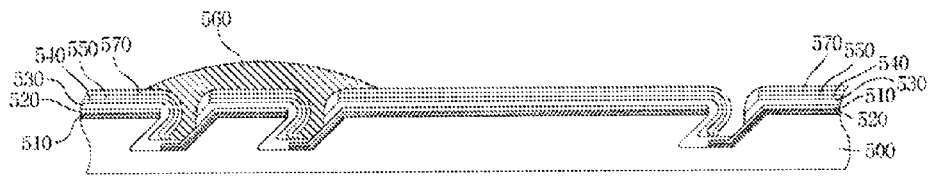

Since the formation of the photovoltaic layer 530 of FIG. 6d, the formation of the second electrode layer 540 of FIG. 6e, the etching of the photovoltaic layer 530 of FIGS. 6f and 6j, the formation of the conductive layer 550 of FIG. 6g, the formation of the bus bar area of FIG. 6h, the formation of the short-circuit preventing layer 570 of FIG. 6i and the formation of the bus bar area of FIG. 6k have been already described in the fifth embodiment, the detailed description thereof will be omitted.

As such, since the auxiliary electrode layer 520 is formed on the substrate 500 prior to the first electrode layer 510, the first electrode layer 510 is exposed within the trenches 501 and 502 when the photovoltaic layer 530 is etched. The conductive layer 550 is connected to the first electrode layer 510 within the trenches 501 and 502.

While the first to the sixth embodiments include the substrate in which the trench is formed, the following embodiment relates to a photovoltaic device having a substrate in which the trench is not formed.

Here, first electrode layers 710 having predetermined thicknesses are formed on a substrate 700. An auxiliary electrode layer 720 is formed on the substrate 700 in such a manner as to come in contact with the first electrode layer from a portion of the area between the electrode layers to a portion of the area of the first electrode layer. The auxiliary electrode layer 720 is formed on the first electrode layer 710 in the seventh embodiment. The auxiliary electrode layer 720 is formed under the first electrode layer 710 in the eighth embodiment.

FIGS. 7a to 7k show a method for manufacturing a photovoltaic device according to a seventh embodiment of the present invention.

Figure 7A:
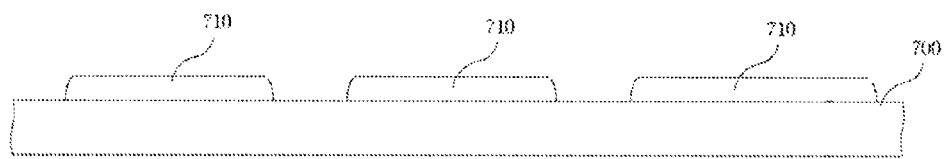
FIGS. 7a to 7k show a method for manufacturing a photovoltaic device according to a seventh embodiment of the present invention.

Referring to FIG. 7a, the first electrode layers 710 having predetermined thicknesses and predetermined widths are formed on the substrate 700 separately from each other by a predetermined interval. While the unit cell area is between the trenches in the foregoing embodiments, the first electrode layer 710 corresponds to the unit cell area in the seventh embodiment and the subsequent embodiment. Since the material of the substrate 700 has been already described, the detailed description thereof will be omitted.

The first electrode layer 710 may be formed by using a printing method in which a sol-gel solution including a material for forming the first electrode layer 710 is used like an ink. Therefore, the first electrode layer 710 may be formed by directly applying the sol-gel solution on the substrate 700 without a polymer pattern or a photoresistor method which uses a mask. In this case, while the sol-gel solution can be directly applied on the substrate 700 by using a roller and the like, a method of applying the sol-gel is not limited to this. Meanwhile, since the first electrode layer 710 formed by the printing method may have high electrical resistance, the first electrode layer 710 may be heat treated in the gas atmosphere such as air or nitrogen.

Such a method makes it possible to directly form the first electrode layer 710 patterned in the form of a band without an etching process according to a mask work. As such, the printing method used for forming the first electrode layer 710 has a relatively simple process and does not require an expensive laser patterning equipment used by existing processes, thereby reducing the manufacturing cost.

The aforementioned method for forming the first electrode layer 710 can be applied to the following embodiments.

Figure 7B:
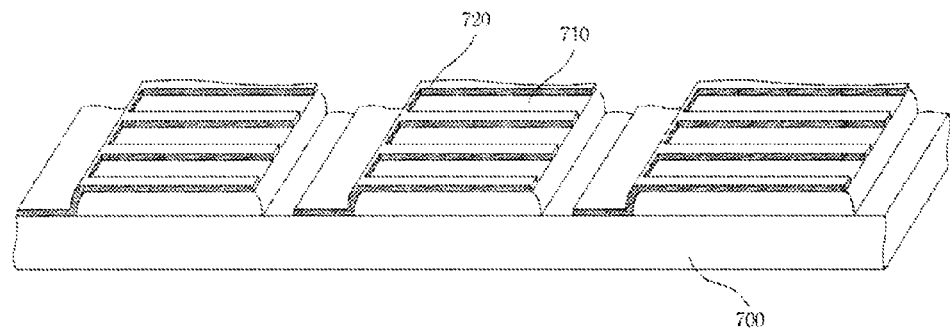
Figure 7C:
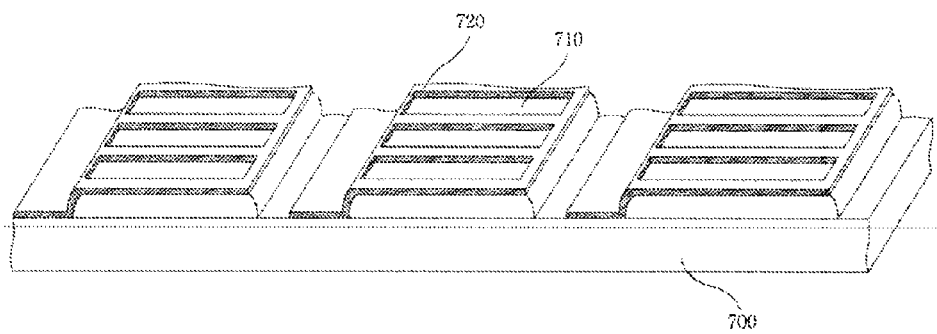

Referring to FIG. 7b, the auxiliary electrode layer 720 is formed from on a portion of the area between the first electrode layers 710 to on a portion of the area of the first electrode layer 710. Here, the auxiliary electrode layer 720 formed on the portion of the area of the first electrode layer 710 may have various shapes capable of allowing light to easily transmit. For example, the auxiliary electrode layer 720 may have a fork shape as shown in FIG. 7b or a ladder shape as shown in FIG. 7c. However the shape of the auxiliary electrode layer 720 is not limited to this. For example, the auxiliary electrode layer 720 may have a mesh shape or a stripe shape. Since the function and effect of the auxiliary electrode layer 720 have been already described above, the description thereof will be omitted.

Figure 7D:

Referring to FIG. 7d, a photovoltaic layer 730 is formed on the substrate 700, on the first electrode layer 710 and on the auxiliary electrode layer 720. The photovoltaic layer 730 is formed on the substrate 700 exposed between the adjacent first electrode layers 710. Since the photovoltaic layer 730 has been already described in the foregoing embodiments, the description thereof will be omitted.

Figure 7E:
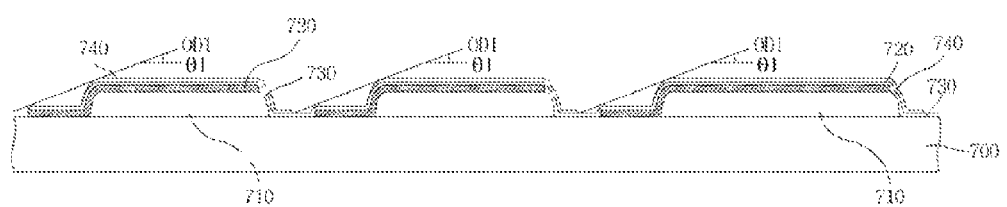

Referring to FIG. 7e, a second electrode layer 740 is formed by obliquely depositing (OD1) a second conductive material on the photovoltaic layer 730. When the second conductive material is obliquely deposited (OD1) at an angle of θ1, the second conductive material is deposited on the photovoltaic layer 730 due to the deposition straightness. Accordingly, the self-aligned second electrode layer 740 is formed.

Figure 7F:
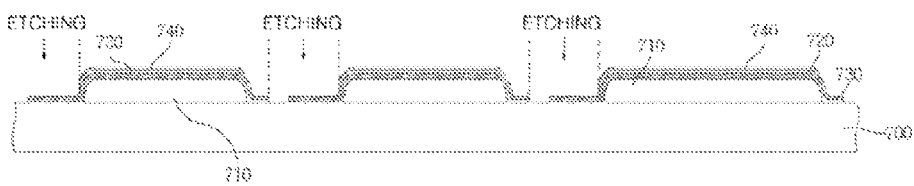

Referring to FIG. 7f, the photovoltaic layer 730 is etched such that the auxiliary electrode layer 720 located in the area between the second electrode layers 740 is exposed. Here, the self-aligned second electrode layer 740 is used as a mask, so that the photovoltaic layer 730 is substantially vertically etched. Here, an etching process is performed on a portion of the photovoltaic layer 730 where the second conductive material is not formed.

Figure 7G:
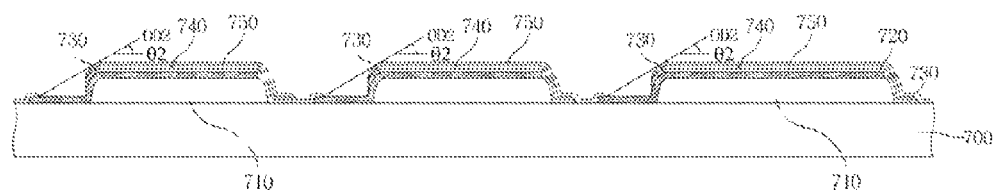

Referring to FIG. 7g, a conductive layer 750 is formed on the second electrode layer 740 by obliquely depositing a third conductive material at an angle of θ2. Here, while the second conductive material is obliquely deposited from one side of the substrate 700, the third conductive material is obliquely deposited from the other side, i.e., the opposite side to the one side of the substrate 700. As a result, the exposed auxiliary electrode layer 720 formed on an area of one first electrode layer among the adjacent first electrode layers 710 is electrically connected to the second electrode layer 740 formed on an area of another first electrode layer 710 by the conductive layer 750. The adjacent unit cells (UCs) are electrically connected in series.

Figure 7H:
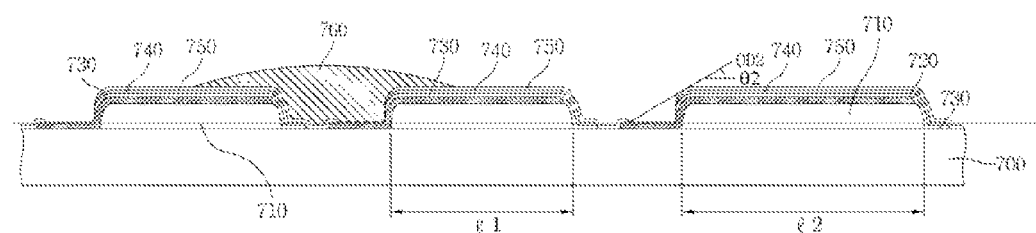

Referring to FIG. 7h, a bus bar area corresponds to an area between the some adjacent first electrode layers 710 among the total first electrode layers 710. A conductive paste 760 comes in contact with the conductive layer 750 formed in the bus bar area. Here, the width 11 of the first electrode layer 710 of the bus bar area may be less than the width 12 of the first electrode layer 710 located in an effective area. Since the bus bar area is an ineffective area which does not generate electric current, the bus bar area may be less than the width 12 of the first electrode layer 710, i.e., an effective area in order to improve the efficiency of the photovoltaic device. In addition, the bus bar (not shown) may be directly formed on the bus bar area by using an ultrasonic adhering process instead of the conductive paste.

Figure 7I:
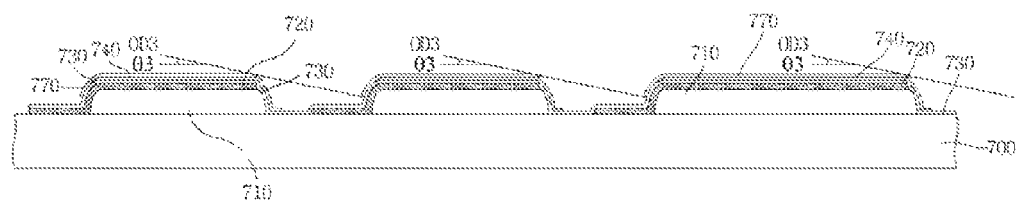

Referring to FIG. 7i, after the second electrode layer 740 is formed and before the photovoltaic layer 730 is etched, a short-circuit preventing layer 770 may be formed for preventing the short-circuit of the electrode layers 710, 720 and 740.

Figure 7J:
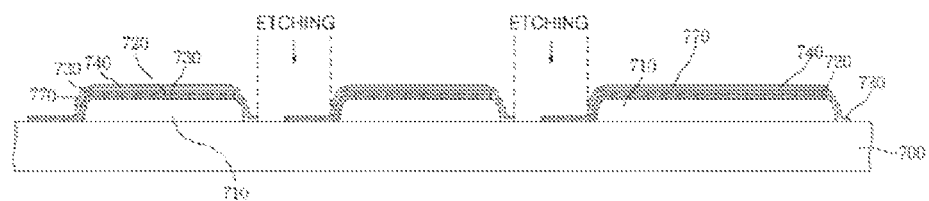

Referring to FIG. 7i, a short-circuit preventing material is obliquely deposited on the photovoltaic layer 730 and the second electrode layer 740 at an angle of θ3 from the opposite side to the one side. Subsequently, as shown in FIG. 7j, the photovoltaic layer 730 is etched such that the auxiliary electrode layer 720 is exposed by the short-circuit preventing layer 770 and the self-aligned second electrode layer 740.

Here, since the etched area is smaller than the etched area of FIG. 7f and the short-circuit preventing layer 770 covers the end of the second electrode layer 740, it is possible to prevent the short-circuit between the end of the second electrode layer 740 and the first electrode layer 710 or between the end of the second electrode layer 740 and the auxiliary electrode layer 720. The short-circuit preventing layer 770 may be formed of the same material as that of the second electrode layer 740.

Figure 7K:
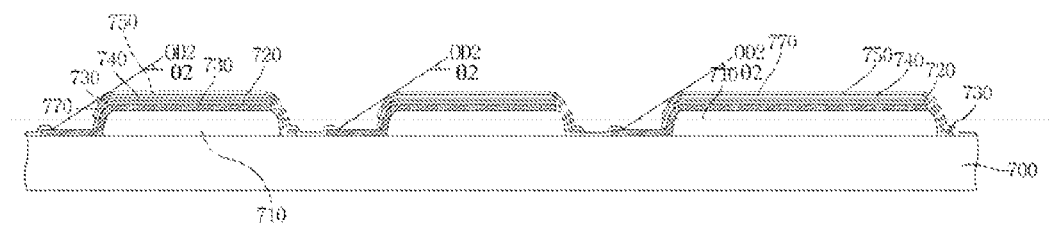

Referring to FIG. 7k, the third conductive material is obliquely deposited at an angle of θ2, so that the conductive layer 750 is formed on the short-circuit preventing layer 770. The conductive layer 750 is connected to the auxiliary electrode layer 720 located in the area between the adjacent first electrode layers 710. The adjacent unit cells (UCs) are electrically connected in series.

FIGS. 8a to 8k show a method for manufacturing a photovoltaic device according to an eighth embodiment of the present invention.

Figure 8A:
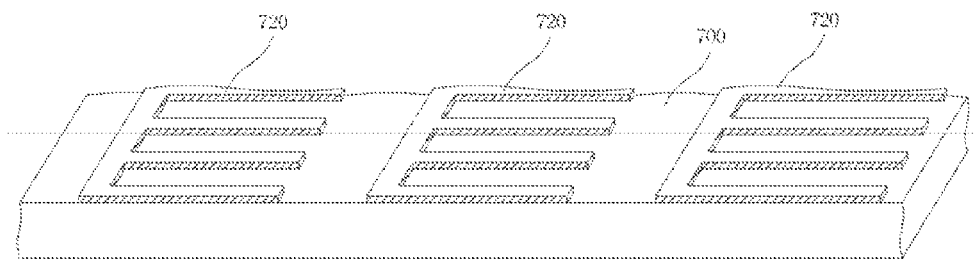
FIGS. 8a to 8k show a method for manufacturing a photovoltaic device according to an eighth embodiment of the present invention.
Figure 8B:
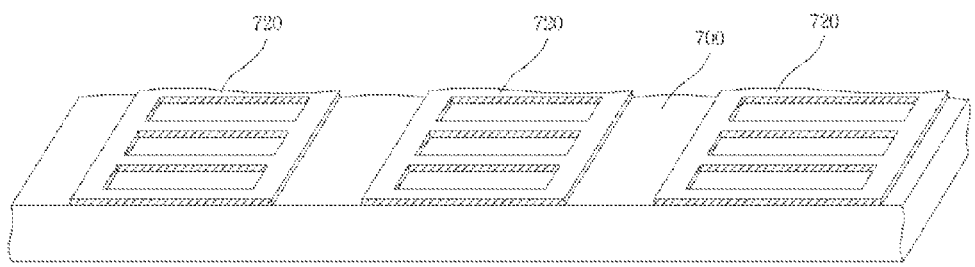
Figure 8C:
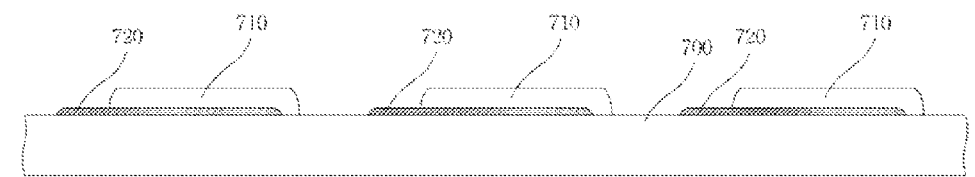

Referring to FIGS. 8a to 8c, in the eighth embodiment, unlike the seventh embodiment, the auxiliary electrode layer 720 may be formed on the substrate 700 prior to the first electrode layer 710. Since the first electrode layer 710 is located on the auxiliary electrode layer 720, and since a lateral surface of the first electrode layer 710 is located on the auxiliary electrode layer 720, the auxiliary electrode layer 720 is exposed when the photovoltaic layer 730 is etched. The conductive layer 750 is connected to the auxiliary electrode layer 720.

Figure 8D:
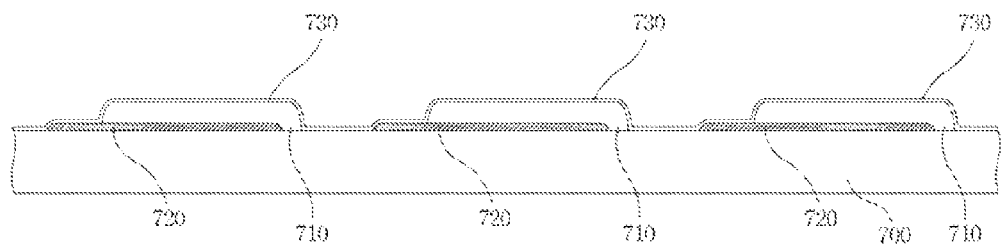
Figure 8E:
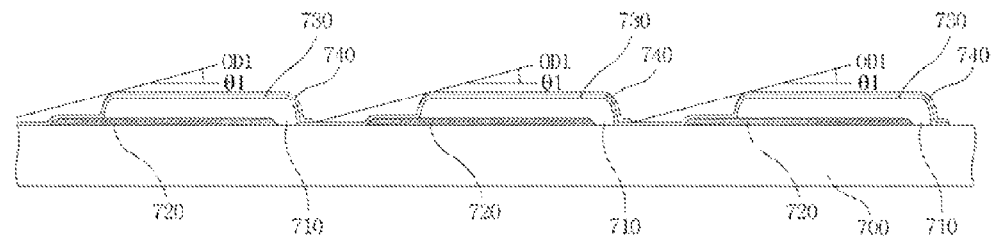
Figure 8F:
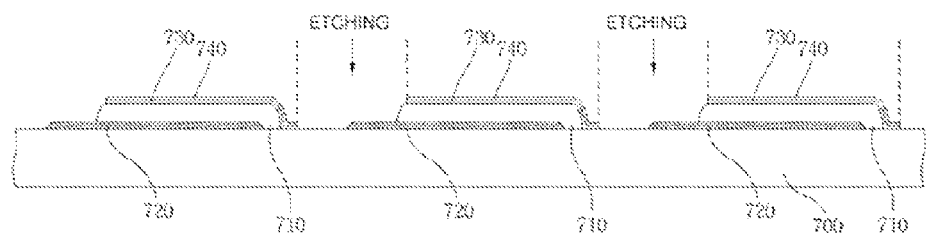
Figure 8G:
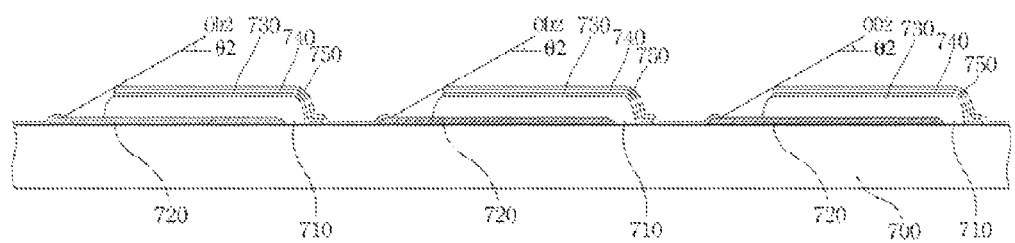
Figure 8H:
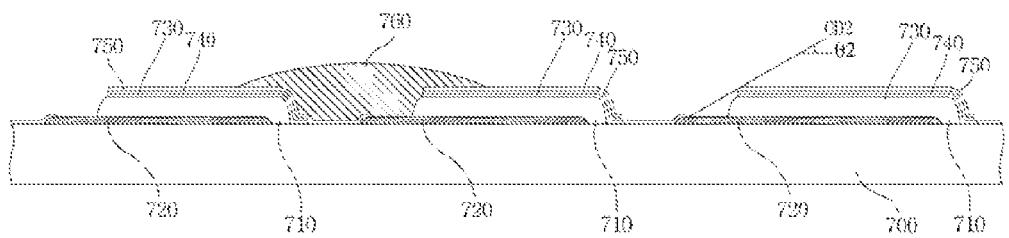
Figure 8I:
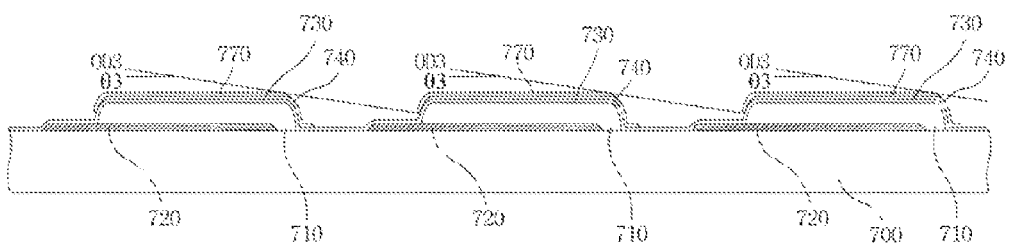
Figure 8J:
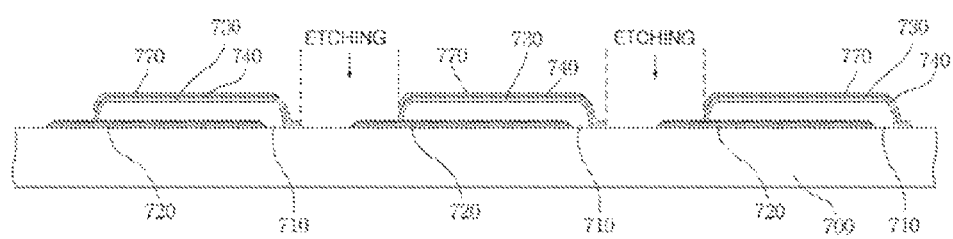
Figure 8K:
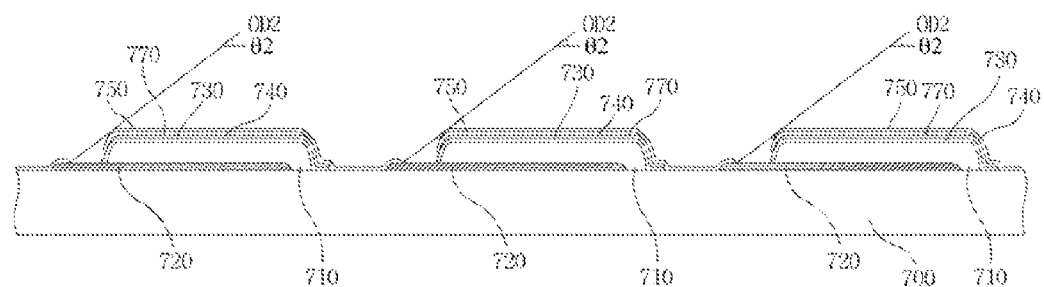

Since the formation of the photovoltaic layer 730 of FIG. 8d, the formation of the second electrode layer 740 of FIG. 8e the etching of the photovoltaic layer 730 of FIGS. 8f and 8j, the formation of the conductive layer 750 of FIGS. 8g and 8k, the formation of the bus bar area of FIG. 8h, the formation of the short-circuit preventing layer 770 of FIG. 8i have been already described in the seventh embodiment, the detailed description thereof will be omitted.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art.

What is claimed is:

1. A photovoltaic device comprising:
    a substrate having trenches, each trench having a bottom surface, one side surface and an opposing other side surface (101; 102; 103; 104; 301; 302; 303; 304; 501; 502) formed therein;
    a first electrode layer (110; 310; 510) continuously formed on a portion of the bottom surface of and on one side surface of each of the trenches and on an area of the substrate between each of the trenches and a trench adjacent to each of the trenches in the direction of the one side;
    an auxiliary electrode layer (120; 320; 520) being formed on a portion of the bottom surface of and on the one side surface of each of the trenches and on the area of the substrate between each of the trenches and the trench adjacent to each of the trenches in the direction of the one side, having an electrical resistance less than that of the first electrode layer and being located on or under the first electrode layer or on a same plane with the first electrode layer so as to contact with a portion of the first electrode layer, wherein an area of the auxiliary electrode layer is less than an area of the first electrode layer on the area of the substrate between each of the trenches and the trench adjacent to each of the trenches in the direction of the one side;

a photovoltaic layer (130; 330; 530) located on at least one of the first electrode layer and on the auxiliary electrode layer;

a second electrode layer (140; 340; 540) located on the photovoltaic layer and formed on the other side surface of each of the trenches and on an area of the substrate between each of the trenches and a trench adjacent to each of the trenches in the direction of the other side; and a conductive layer (160; 350; 550) allowing the second electrode layer which is formed on the area of the substrate between each of the trenches and the trench adjacent to each of the trenches in the direction of the other side and either the first electrode layer or the auxiliary electrode layer which is formed on the area of the substrate between each of the trenches and the trench adjacent to each of the trenches in the direction of the one side to be electrically connected to each other within the trench.

2. The photovoltaic device of claim 1, wherein the trench is inclined at a predetermined angle.

3. The photovoltaic device of claim 1, further comprising an conductive paste (170) with which one trench among the trenches is buried.

4. The photovoltaic device of claim 1, wherein an interval between certain adjacent trenches among the trenches is less than an interval between adjacent trenches corresponding to an effective area.

5. The photovoltaic device of claim 1, wherein grooves (302; 304) through which light, is transmitted are located between the adjacent trenches, and wherein the auxiliary electrode layer is located between the grooves.

6. The photovoltaic device of claim 5, wherein either a ratio of a depth of the groove to a width of the groove or a ratio of a depth of the groove to a diameter of the groove is greater than a ratio of a depth of the trench to a width of the trench.

7. The photovoltaic device of claim 5, wherein a bottom surface of the groove is exposed.

8. The photovoltaic device of claim 5, wherein the groove penetrates through the substrate.

9. The photovoltaic device of claim 1, further comprising short-circuit preventing layers (180; 370; 570) covering one end of the second electrode layer.

\* \* \* \* \*